(12) United States Patent
Lu et al.

(10) Patent No.: US 11,362,220 B2
(45) Date of Patent: Jun. 14, 2022

(54) LOCAL METALLIZATION FOR SEMICONDUCTOR SUBSTRATES USING A LASER BEAM

(71) Applicant: SunPower Corporation, San Jose, CA (US)

(72) Inventors: Pei Hsuan Lu, San Jose, CA (US); Benjamin I. Hsia, Fremont, CA (US); David Aaron R. Barkhouse, Oakland, CA (US); Lee Gorny, Mountain View, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 16/376,802

(22) Filed: Apr. 5, 2019

(65) Prior Publication Data
US 2019/0312156 A1    Oct. 10, 2019

Related U.S. Application Data

(60) Provisional application No. 62/773,172, filed on Nov. 29, 2018, provisional application No. 62/773,168,
(Continued)

(51) Int. Cl.
*H01L 31/02* (2006.01)
*H01L 31/18* (2006.01)
*H01L 31/0368* (2006.01)

(52) U.S. Cl.
CPC .. *H01L 31/02008* (2013.01); *H01L 31/03682* (2013.01); *H01L 31/1804* (2013.01); *H01L 31/186* (2013.01)

(58) Field of Classification Search
CPC . H01L 31/1804; H01L 31/186; H01L 31/188; H01L 31/0516; H01L 31/022441;
(Continued)

(56) References Cited

U.S. PATENT DOCUMENTS 3,993,533 A    11/1976 Milnes et al.
4,023,005 A    5/1977 Bolin
(Continued)

FOREIGN PATENT DOCUMENTS

CN    102132423    7/2011
DE    10020412    11/2001
(Continued)

OTHER PUBLICATIONS

Merriam Webster Dictionary definition for Discrete, https://www.merriam-webster.com/dictionary/discrete (Year: 2009).*
(Continued)

*Primary Examiner* — Andrew J Golden
(74) *Attorney, Agent, or Firm* — Schwabe, Williamson & Wyatt, P.C.

(57) ABSTRACT

Local metallization of semiconductor substrates using a laser beam, and the resulting structures, e.g., micro-electronic devices, semiconductor substrates and/or solar cells, are described. For example, a solar cell includes a substrate and a plurality of semiconductor regions disposed in or above the substrate. A plurality of conductive contact structures is electrically connected to the plurality of semiconductor regions. Each conductive contact structure includes a locally deposited metal portion disposed in contact with a corresponding a semiconductor region.

6 Claims, 20 Drawing Sheets

Related U.S. Application Data filed on Nov. 29, 2018, provisional application No. 62/773,148, filed on Nov. 29, 2018, provisional application No. 62/654,198, filed on Apr. 6, 2018.

(58) Field of Classification Search
CPC ....... H01L 31/022433; H01L 31/02008; H01L 31/03682; H01L 31/0682
USPC .................................................. 136/243–265
See application file for complete search history.

(56) References Cited

U.S. PATENT DOCUMENTS

| | | | |
|---|---|---|---|
| 4,058,418 A | 11/1977 | Lindmayer | |
| 4,318,938 A | 3/1982 | Barnett et al. | |
| 4,393,576 A | 7/1983 | Dahlberg | |
| 4,400,577 A | 8/1983 | Spear | |
| 4,433,200 A | 2/1984 | Jester et al. | |
| 4,461,922 A | 7/1984 | Gay et al. | |
| 4,482,780 A | 11/1984 | Mitchell | |
| 4,581,103 A | 4/1986 | Levine et al. | |
| 4,582,588 A | 4/1986 | Jensen et al. | |
| 4,617,421 A | 10/1986 | Nath et al. | |
| 4,691,076 A | 9/1987 | Levine et al. | |
| 4,695,674 A | 9/1987 | Bar-on | |
| 4,697,041 A | 9/1987 | Okaniwa et al. | |
| 4,882,298 A | 11/1989 | Moeller et al. | |
| 4,917,752 A | 4/1990 | Jensen et al. | |
| 4,957,601 A | 9/1990 | Levine et al. | |
| 5,091,319 A | 2/1992 | Hotchkiss et al. | |
| 5,380,371 A | 1/1995 | Murakami | |
| 5,951,786 A | 9/1999 | Gee et al. | |
| 5,980,679 A | 11/1999 | Severin et al. | |
| 6,159,832 A | 12/2000 | Mayer | |
| 6,288,326 B1 | 9/2001 | Hayashi et al. | |
| 6,448,155 B1 | 9/2002 | Iwasaki et al. | |
| 6,635,307 B2 | 10/2003 | Huang et al. | |
| 7,355,114 B2 | 4/2008 | Ojima et al. | |
| 7,687,334 B2 | 3/2010 | Zou et al. | |
| 8,003,530 B2 | 8/2011 | Grohe et al. | |
| 8,146,643 B2 | 4/2012 | Kasahara et al. | |
| 8,809,192 B2 | 8/2014 | Bertram et al. | |
| 9,040,409 B2 | 5/2015 | Kumar et al. | |
| 9,620,661 B2 | 4/2017 | Kim et al. | |
| 2001/0029976 A1 | 10/2001 | Takeyama et al. | |
| 2002/0159740 A1 | 10/2002 | Beall et al. | |
| 2005/0253142 A1 | 11/2005 | Negami et al. | |
| 2006/0166023 A1 | 7/2006 | Yoshikata et al. | |
| 2006/0213548 A1 | 9/2006 | Bachrach et al. | |
| 2008/0042153 A1 | 2/2008 | Beeson et al. | |
| 2008/0053511 A1 | 3/2008 | Nakamura | |
| 2008/0128019 A1 | 6/2008 | Lopatin et al. | |
| 2008/0216887 A1 | 9/2008 | Hacke et al. | |
| 2008/0223429 A1 | 9/2008 | Everett et al. | |
| 2009/0194162 A1 | 8/2009 | Sivaram et al. | |
| 2009/0266399 A1 | 10/2009 | Bulent et al. | |
| 2009/0305076 A1 | 12/2009 | Wong et al. | |
| 2009/0314344 A1 | 12/2009 | Fork et al. | |
| 2010/0032013 A1 | 2/2010 | Krause et al. | |
| 2010/0051085 A1 | 3/2010 | Weidman et al. | |
| 2010/0084748 A1 | 4/2010 | Poddar et al. | |
| 2010/0200058 A1 | 8/2010 | Funakoshi | |
| 2010/0243041 A1 | 9/2010 | Carlson et al. | |
| 2010/0275965 A1 | 11/2010 | Lee et al. | |
| 2011/0073165 A1 | 3/2011 | Lee | |
| 2011/0076847 A1 | 3/2011 | Aqui et al. | |
| 2011/0120752 A1 | 5/2011 | Imai et al. | |
| 2011/0136265 A1 | 6/2011 | Shigenobu et al. | |
| 2011/0186117 A1 | 8/2011 | Kumar et al. | |
| 2012/0097245 A1 | 4/2012 | Nishina et al. | |
| 2012/0103408 A1* | 5/2012 | Moslehi .......... H01L 31/022441 | 136/256 |
| 2012/0234388 A1* | 9/2012 | Stancel ............... H01L 31/0504 | 136/259 |
| 2012/0240995 A1 | 9/2012 | Coakley | |
| 2013/0068287 A1 | 3/2013 | Compaan | |
| 2013/0112233 A1 | 5/2013 | Coakley | |
| 2013/0160825 A1 | 6/2013 | Lantzer et al. | |
| 2013/0183796 A1 | 7/2013 | Stewart et al. | |
| 2013/0247977 A1 | 9/2013 | Kumai et al. | |
| 2014/0113400 A1 | 4/2014 | Takahashi | |
| 2014/0174519 A1 | 6/2014 | Rim et al. | |
| 2014/0190546 A1 | 7/2014 | Fukumochi et al. | |
| 2014/0338739 A1 | 11/2014 | Liu et al. | |
| 2015/0004737 A1 | 1/2015 | Harley | |
| 2015/0090329 A1* | 4/2015 | Pass ................ H01L 31/022441 | 136/256 |
| 2015/0129031 A1 | 5/2015 | Moslehi et al. | |
| 2015/0325710 A1 | 11/2015 | Tu | |
| 2016/0020343 A1* | 1/2016 | Carlson ............... H01L 31/1804 | 438/96 |
| 2016/0133759 A1 | 5/2016 | Pass et al. | |
| 2016/0181447 A1* | 6/2016 | Kim ................ H01L 31/022441 | 136/256 |
| 2017/0062633 A1 | 3/2017 | Carlson et al. | |
| 2017/0179312 A1 | 6/2017 | Kim et al. | |
| 2017/0250297 A1 | 8/2017 | Harley | |
| 2017/0365731 A1 | 12/2017 | Lin et al. | |
| 2018/0097129 A1 | 4/2018 | Pass | |

FOREIGN PATENT DOCUMENTS

| | | |
|---|---|---|
| DE | 10 2013-204468 | 9/2014 |
| EP | 1634673 | 3/2006 |
| JP | 2003/246971 | 9/2003 |
| JP | 2009/130116 | 6/2009 |
| JP | 2011/054831 | 3/2011 |
| JP | 2012/501551 | 1/2012 |
| KR | 10-1267398 | 1/2013 |
| KR | 20130005727 A | 1/2013 |
| TW | 2010/27773 | 7/2010 |
| WO | WO 1999/040760 | 8/1999 |
| WO | WO 2010/025269 | 3/2010 |
| WO | WO 2013/142892 | 10/2013 |
| WO | 2014023668 A1 | 2/2014 |
| WO | 2016036224 A1 | 3/2016 |
| WO | WO 2016-036224 | 3/2016 |

OTHER PUBLICATIONS

Roder et al, 30 µm Wide Contacts on Silicon Cells by Laser Transfer, 2010, 35th IEEE Photovoltaic Specialists Conference, Honolulu, HI, USA, 2010, pp. 003597-003599 (Year: 2010).*

International Search Report and Written Opinion from PCT/US2019/026151 dated Jul. 31, 2019, 12 pgs.

Cotter, et al., "Novel Process for Simplified Buried Contact Solar Cells," Institute of Electrical and Electronics Engineers, Aug. 2000, pp. 303-306.

Lu, et al., "Laser-Doping through Anodic Aluminum Oxide Layers for Silicon Solar Cells," Journal of Nanomaterials, vol. 2015, Article ID 870839, Jul. 1, 2015, 6 pgs.

Nekarda, et al., "Laser-Based Foil Metallization for Industrial Perc Solar Cells," Presented at the 28th European Photovoltaic Solar Energy Conference and Exhibition; Paris, Sep. 30-Oct. 2013, 3 pgs.

Graf, et al., "Foil Metallization Process for Perc Solar Cells Towards Industrial Feasibility," Presented at the 31st European PV Solar Energy Conference and Exhibition, Sep. 14-18, 2015, Hamburg, Germany, 4 pgs.

Schulte-Huxel, et al., "Al-Foil on Encapsulant for the Interconnection of Al-Metalized Silicon Solar Cells," Article in IEEE Journal of Photovoltaics—Jan. 2013, 7 pgs.

Schulte-Huxel, et al., "Laser microwelding of thin Al layers for interconnection of crystalline Si solar cells: analysis of process limits for ns and µs lasers," Article in Journal of Photonics for Energy—Aug. 2014, 15 pgs.

Schulte-Huxel, et al., "Aluminum-Based Mechanical and Electrical Laser Interconnection Process for Module Integration of Silicon Solar Cells," in IEEE Journal of Photovoltaics, vol. 2, No. 1, pp. 16-21, Jan. 2012, 6 pgs.

(56) References Cited

OTHER PUBLICATIONS

Non-final Notice of Reasons for Rejection from Japanese Patent Application No. 2018-182848 dated Oct. 16, 2019, 7 pgs.
First Office Notification from Chinese Patent Application No. 2019800247005 dated Nov. 11, 2020, 2 pgs.
International Preliminary Report on Patentability from PCT/US2019/026151 dated Oct. 15, 2020, 9 pgs.
Pre-Interview First Office Action from U.S. Appl. No. 16/377,053 dated Nov. 12, 2020; 16 pgs.
FAI Office Action from U.S. Appl. No. 16/377,053 dated Feb. 16, 2021; 5 pgs.
Final Office Action from U.S. Appl. No. 16/377,053 dated Aug. 21, 2021; 18 pgs.
International Preliminary Report on Patentability from PCT/US2019/026186 dated Oct. 15, 2020; 9 pgs.
International Search Report and Written Opinion from PCT/US2019/026186 dated Jul. 25, 2019; 12 pgs.
International Preliminary Report on Patentability from PCT/US2019/026190 dated Oct. 15, 2020; 6 pgs.
International Search Report and Written Opinion from PCT/US2019/026190 dated Sep. 22, 2020; 9 pgs.
FAI Office Action from U.S. Appl. No. 16/377,074 dated Mar. 23, 2020; 5 pgs.
Pre-Interview First Office Action from U.S. Appl. No. 16/377,074 dated Dec. 27, 2019; 13 pgs.
Final Office Action from U.S. Appl. No. 16/377,074 dated Oct. 14, 2020; 25 pgs.
Non-Final Office Action from U.S. Appl. No. 16/377,074 dated Apr. 28, 2021; 32 pgs.
International Preliminary Report on Patentability from PCT/US2019/026188 dated Oct. 15, 2020; 9 pgs.
International Search Report and Written Opinion from PCT/US2019/026188 dated Jul. 25, 2019; 12 pgs.
FAI Office Action from U.S. Appl. No. 16/377,000 dated Jun. 8, 2020; 5 pgs.
Pre-Interview First Office Action from U.S. Appl. No. 16/377,000 dated Mar. 2, 2020; 13 pgs.
Final Office Action from U.S. Appl. No. 16/377,000 dated Oct. 27, 2020; 20 pgs.
Non-Final Office Action from U.S. Appl. No. 16/377,000 dated Apr. 28, 2021; 23 pgs.
Extended European Search Report from European Patent Application No. 19782324.8 dated Apr. 7, 2021; 14 pgs.
International Preliminary Report on Patentability from PCT/US2019/026166 dated Oct. 15, 2020; 9 pgs.
International Search Report and Written Opinion from PCT/US2019/026166 dated Aug. 2, 2019; 12 pgs.
International Preliminary Report on Patentability from PCT/US2019/026189 dated Oct. 15, 2020; 8 pgs.
International Search Report and Written Opinion from PCT/US2019/026189 dated Jul. 25, 2019; 11 pgs.
FAI Office Action from U.S. Appl. No. 16/377,102 dated Mar. 23, 2020; 7 pgs.
Pre-Interview First Office Action from U.S. Appl. No. 16/377,102 dated Dec. 20, 2019; 12 pgs.
Final Office Action from U.S. Appl. No. 16/377,102 dated Oct. 14, 2020; 20 pgs.
Non-Final Office Action from U.S. Appl. No. 16/377,102 dated Mar. 3, 2021; 21 pgs.
Extended European Search Report from European Patent Application No. 19781261.3 dated Mar. 31, 2021, 13 pgs.

\* cited by examiner

LOCAL METALLIZATION FOR SEMICONDUCTOR SUBSTRATES USING A LASER BEAM

CROSS REFERENCE TO RELATED APPLICATIONS

This application claims the right of priority to and benefit of earlier filing date of U.S. Provisional Application No. 62/773,172, filed on Nov. 29, 2018, U.S. Provisional Application No. 62/773,168, filed on Nov. 29, 2018, U.S. Provisional Application No. 62/773,148, filed on Nov. 29, 2018, and U.S. Provisional Application No. 62/654,198, filed on Apr. 6, 2018, each of which is hereby incorporated by reference herein in its entirety.

TECHNICAL FIELD

Embodiments of the present disclosure are in the field of renewable energy or semiconductor processing and, in particular, include local metallization of substrates using a laser beam, and the resulting structures.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Electrical conversion efficiency is an important characteristic of a solar cell as it is directly related to the capability of the solar cell to generate power; with higher efficiency providing additional value to the end customer; and, with all other things equal, higher efficiency also reduces manufacturing cost per Watt. Likewise, simplified manufacturing approaches provide an opportunity to lower manufacturing costs by reducing the cost per unit produced. Accordingly, techniques for increasing the efficiency of solar cells and techniques for simplifying the manufacturing of solar cells are generally desirable.

DETAILED DESCRIPTION

Figure 1A:
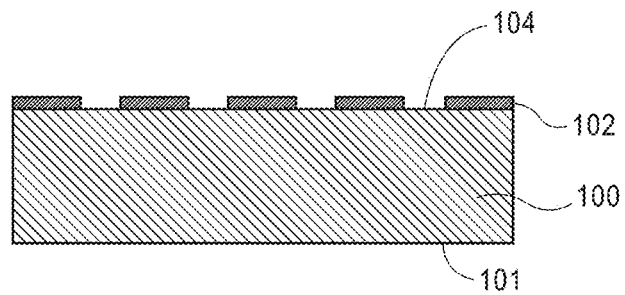
FIGS. 1A-1H illustrate cross-sectional views of various operations in a method of fabricating a solar cell.

The following detailed description is merely illustrative in nature and is not intended to limit the embodiments or the application and uses of such embodiments. As used herein, the word "exemplary" means "serving as an example, instance, or illustration." Any implementation described herein as exemplary is not necessarily preferred or advantageous over other implementations. Furthermore, there is no intention to be bound by any expressed or implied theory presented in the preceding technical field, background, brief summary or the following detailed description.

References to "one embodiment" or "an embodiment" do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"Regions" or "portions" describe discrete areas, volumes, divisions or locations of an object or material having definable characteristics but not always fixed boundaries.

"Comprising" is an open-ended term that does not foreclose additional structure or steps.

"Configured to" connotes structure by indicating a device, such as a unit or a component, includes structure that performs a task or tasks during operation, and such structure is configured to perform the task even when the device is not currently operational (e.g., is not on/active). A device "configured to" perform one or more tasks is expressly intended to not invoke a means or step plus function interpretation under 35 U.S.C. § 112, (f) or sixth paragraph.

"First," "second," etc. terms are used as labels for nouns that they precede, and do not imply any type of ordering (e.g., spatial, temporal, logical, etc.). For example, reference to a "first" solar cell does not necessarily mean such solar cell is the first solar cell in a sequence; instead the term "first" is used to differentiate this solar cell from another solar cell (e.g., a "second" solar cell).

"Coupled" refers to elements, features, structures or nodes, unless expressly stated otherwise, that are or can be directly or indirectly joined or in communication with another element/node/feature, and not necessarily directly mechanically joined together.

"Inhibit" describes reducing, lessening, minimizing or effectively or actually eliminating something, such as completely preventing a result, outcome or future state completely.

"Exposed to a laser beam" describes a process subjecting a material to incident laser light, and can be used interchangeably with "subjected to a laser," "processed with a laser" and other similar phrases.

"Doped regions," "semiconductor regions," and similar terms describe regions of a semiconductor disposed in, on, above or over a substrate. Such regions can have a N-type conductivity or a P-type conductivity, and doping concentrations can vary. Such regions can refer to a plurality of regions, such as first doped regions, second doped regions, first semiconductor regions, second semiconductor regions, etc. The regions can be formed of a polycrystalline silicon on a substrate or as portions of the substrate itself.

"Thin dielectric layer," "tunneling dielectric layer," "dielectric layer," "thin dielectric material" or intervening layer/material refers to a material on a semiconductor region, between a substrate and another semiconductor layer, or between doped or semiconductor regions on or in a substrate. In an embodiment, the thin dielectric layer can be a tunneling oxide or nitride layer of a thickness of approximately 2 nanometers or less. The thin dielectric layer can be referred to as a very thin dielectric layer, through which electrical conduction can be achieved. The conduction can be due to quantum tunneling and/or the presence of small regions of direct physical connection through thin spots in the dielectric layer. Exemplary materials include silicon oxide, silicon dioxide, silicon nitride, and other dielectric materials.

"Intervening layer" or "insulating layer" describes a layer that provides for electrical insulation, passivation, and inhibit light reflectivity. An intervening layer can be several layers, for example a stack of intervening layers. In some contexts, the intervening layer can be interchanged with a tunneling dielectric layer, while in others the intervening layer is a masking layer or an "antireflective coating layer" (ARC layer). Exemplary materials include silicon nitride, silicon oxynitride, silicon oxide (SiOx) silicon dioxide, aluminum oxide, amorphous silicon, polycrystalline silicon, molybdenum oxide, tungsten oxide, indium tin oxide, tin oxide, vanadium oxide, titanium oxide, silicon carbide and other materials and combinations thereof. In an example, the intervening layer can include a material that can act as a moisture barrier. Also, for example, the insulating material can be a passivation layer for a solar cell. In an example the intervening layer can be a dielectric double layer, such as a silicon oxide ($SiO_x$), for example with high hydrogen content, aluminum oxide ($Al_2O_3$) dielectric double layer.

"Locally deposited metal" and "metal deposition" are used to describe forming a metal region by exposing a metal source to a laser that forms and/or deposits metal from the metal source onto portions of a substrate. This process is not limited to any particular theory or mechanism of metal deposition. In an example, locally deposited metal can be formed upon exposure of a metal foil to a laser beam that forms and/or deposits metal from the metal foil, such as all of the metal foil exposed to the laser beam, onto portions of a silicon substrate. This process can be referred to as a "Laser Assisted Metallization Patterning" or LAMP technique. The locally deposited metal can have a thickness of 1 nanometers (nm) to 20 microns (μm), a width approximately defined by the laser beam size, and physical and electrical properties matching those of the source metal foil.

"Patterning" refers to a process of promoting separation or separating portions of a source metal, and can specifically refer to weakening a region of a metal foil that is between a bulk of the metal foil and a deposited region of the metal foil (i.e., the deposited metal). This patterning can be the result of heat, perforation, deformation or other manipulation of the metal foil by the same laser process, LAMP, that deposits a metal foil onto a substrate, and can promote removal of the bulk of the metal foil (i.e., the non-deposited metal foil) from the resulting device. Unless expressed otherwise, references to LAMP includes such patterning.

"Substrate" can refer to, but is not limited to, semiconductor substrates, such as silicon, and specifically such as single crystalline silicon substrates, multi-crystalline silicon substrates, wafers, silicon wafers and other semiconductor substrates used for solar cells. In an example, such substrates can be used in micro-electronic devices, photovoltaic cells or solar cells, diodes, photo-diodes, printed circuit boards, and other devices. These terms are used interchangeably herein. A substrate also can be glass, a layer of polymer or another material.

"About" or "approximately". As used herein, the terms "about" or "approximately" in reference to a recited numeric value, including for example, whole numbers, fractions, and/or percentages, generally indicates that the recited numeric value encompasses a range of numerical values (e.g., +/−5% to 10% of the recited value) that one of ordinary skill in the art would consider equivalent to the recited value (e.g., performing substantially the same function, acting in substantially the same way, and/or having substantially the same result).

In addition, certain terminology can also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology can include the words specifically mentioned above, derivatives thereof and words of similar import.

As described in further detail below, aspects of this disclosure relate to increased solar cell conversion efficiency and/or lower manufacturing costs by providing novel processes for fabricating solar cell structures.

Local metallization of substrates, for example semiconductor substrates, using a laser beam, and the resulting structures, e.g., micro-electronic devices, semiconductor substrates and/or solar cells, are described herein. In accordance with one or more examples of a LAMP technique, a metal for a conductor contact is effectively deposited and patterned, and this process can be accomplished in a single operation with a laser. In an exemplary process, a metal foil (as a metal source) is placed over a surface of a substrate, such as a semiconductor solar cell, and portions of the metal foil are exposed to a laser beam to create localized high density plasma and heat for localized metal deposition while at the same time patterning the source metal foil (the source metal layer After the deposition and patterning process, remnants of the source of the metal layer can be removed in a subsequent process. For example, portions of a metal foil that are not exposed to the laser beam are removed (i.e., non-deposited metal foil is removed). In a further example, portions of the metal foil are exposed to a subsequently applied laser beam, such as another laser beam and/or exposed to a laser having different properties (e.g., power, frequency, etc.). This subsequent processing can provide further patterning of the metal foil for purposes of removing the non-deposited metal foil. In certain implementations, a LAMP technique is repeated on a substrate in successive steps to form a metal layer on the substrate. In particular, a first foil is subjected to a first LAMP technique to form first conductive contact structures on first portions or regions of the substrate, and a second foil is subjected to a second LAMP technique on second portions or regions of the substrate. This second LAMP technique can occur after portions of the first foil that were not subjected to the first LAMP technique are removed, and the second portions or regions can be located on regions of the substrate where theses portions of the first foil were removed. Likewise, portions of the second foil that were not subjected to the second LAMP technique can be removed, and similar third, fourth, etc. LAMP techniques can be performed successively to form the metal layer on the substrate. This implementation can be used in an example where the to-be-removed portions of foil are difficult to remove due to shape or proximity to other features, such as metal features, on the substrate.

Not to be bound by theory, the above described localized metal deposition achieved by exposing a metal foil to a laser beam can be achieved by partial or full melt of the laser irradiated portions of the metal foil, by partial or full ablation of portions of the metal foil with subsequent re-deposition onto the wafer surface, and/or by laser sputtering of portions of a metal foil during a laser deposition and patterning process of the metal foil. In an example, first portions of the metal foil are exposed to a laser beam and subsequently deposited on the wafer surface, while patterning the source metal foil layer at the same time. Additionally, certain implementations result in these first portions of the metal foil being fully or at least partially connected to adjacent second portions of the metal foil that have not been exposed to laser irradiation. A region of the metal foil between the first and second portions can have a relatively weakened physical structure (as compared to the second portions) that promotes separation of the second portions from the first portions to create discrete conductive paths.

Conventional metal deposition and patterning of a metal layer for a solar cell can include using a vacuum chamber for metal deposition or a chemical bath for metal plating. One or more patterning operations is also typically performed to identify regions where a deposited metal needs to be removed. In contrast, the disclosed metallization approaches effectively achieve metal deposition and patterning in a single process operation, eliminating or eliminating the need for previously required processes. However, a LAMP technique can be used in addition to (e.g., after) conventional metal deposition.

Several implementations discussed herein can provide less costly and faster metallization than using optical lithography (and omission of an associated etch process), and potentially more precise patterning with smaller feature width and higher aspect ratio compared to screen printing. LAMP techniques enable direct deposition and patterning of metal on a substrate using an inexpensive metal foil in a single operation process via a laser, and represents a significant cost advantage over competing technologies. LAMP techniques also enable the fabrication of relatively small features. Specifically, tighter pitch and higher efficiency can be achieved as compared with structures typically formed using screen printing. In an example, screen printed conductive contacts can include silver paste having a thickness of up to 50 microns and a minimum feature size of 50 microns. In contrast, LAMP techniques can result in a thickness of approximately 1 nanometers to 20 microns and a minimum feature size of approximately 25 microns. The deposition thickness can be controlled by the starting thickness of the source material and the laser conditions. The deposited thickness can range from about 5% to about 25% of the source material thickness. The thickness of the source material partially constrains the laser conditions (in particular, the pulse duration) required for LAMP. The thickness of the source material partially constrains the laser conditions (in particular, the pulse duration) required for LAMP. In one embodiment, a metal source material can have a thickness in a range of approximately 1 nm to 1 $\mu$m. In an example, performing laser assisted metallization process (LAMP) can include sputtering metal from a thin source material onto a thin polymer or membrane using a picosecond laser or a femtosecond laser, where the thin source material can have a thickness in a range of approximately 1 nm to 1 $\mu$m. In an embodiment, the metal source material can have a thickness in a range of 1 $\mu$m to 100 $\mu$m, such as 1 $\mu$m to 10 $\mu$m, 5 $\mu$m to 25 $\mu$m, 10 $\mu$m to 50 $\mu$m, 25 $\mu$m to 75 $\mu$m, or 50 $\mu$m to 100 $\mu$m. In an example, performing laser assisted metallization process (LAMP) can include sputtering metal from a metal foil onto a substrate using a picosecond laser or a femtosecond laser, where the metal foil can have a thickness in a range of approximately 1 $\mu$m to 100 $\mu$m. In various implementations of the LAMP techniques disclose parameters for pre- and post-LAMP metal thickness are as described in Table 1.

TABLE 1

| | Pre-LAMP Foil Thickness | Post-LAMP Foil Thickness: Single Foil | Post-Processing Foil Thickness: One layer of a Foil Stack | Post-Processing Foil Thickness: Total of all layers of a Foil Stack (a LAMP layer and additionally bonded layers) |
| --- | --- | --- | --- | --- |
| Target Thickness Examples | 10-50 $\mu$m | 1-10 $\mu$m in LAMP region 1-20 $\mu$m in LAMP region 10-50 $\mu$m or original thickness in non-LAMP region | 1-10 $\mu$m for initial LAMP layer 1-20 $\mu$m for initial LAMP layer 10-50 $\mu$m for additionally bonded layers 20-200 $\mu$m for additionally bonded layers | 10-50 $\mu$m 25-45 $\mu$m 25-200 $\mu$m 10-220 $\mu$m |
| Practical Minimum Thickness Examples | 1 $\mu$m | 60 nm 100 nm | 100 nm 1 $\mu$m | 100 nm |

TABLE 1-continued

| | Pre-LAMP Foil Thickness | Post-LAMP Foil Thickness: Single Foil | Post-Processing Foil Thickness: One layer of a Foil Stack | Post-Processing Foil Thickness: Total of all layers of a Foil Stack (a LAMP layer and additionally bonded layers) |
|---|---|---|---|---|
| Practical Maximum Thickness Examples | 100 μm | 12 μm<br>20 μm | 20 μm<br>200 μm | N/A |

Other advantages include providing a feasible approach to replace the use of silver with less costly aluminum (in the form of an aluminum foil) for metallization of semiconductor features. Furthermore, the aluminum deposited with a LAMP technique can be a pure, monolithic metal, in contrast to screen printed silver, which has higher electrical resistance due to its porosity. In addition to the examples of Table 1, in various examples utilizing aluminum as a metal foil, the solar cell can have a layer (or layers) of aluminum with a thickness of approximately 1 mm-500 μm. The metal foil can include aluminum in an amount greater than approximately 97% and silicon in an amount approximately in the range of 0-2%.

An exemplary aluminum (Al) metal foil has a thickness approximately in the range of 1-100 μm, for example in the range of 1-15 μm, 5-30 μm, 15-40 μm, 25-50 μm 30-75 μm, or 50-100 μm. The Al metal foil can be a temper grade metal foil such as, but not limited to, F-grade (as fabricated), O-grade (full soft), H-grade (strain hardened) or T-grade (heat treated). The aluminum metal foil can be anodized or not, and can include one or more coatings. Multilayer metal foils can also be used. Exemplary metal foils include metal foils of aluminum, copper, tin, tungsten, manganese, silicon, magnesium, zinc, lithium and combinations thereof with or without aluminum in stacked layers or as alloys.

In another example, an operation to form metal and pattern a metal layer for a semiconductor device (e.g., a solar cell) can include first forming a first metal layer on a substrate (e.g., a metal seed layer) via conventional or LAMP techniques, locating a second metal layer (such as an aluminum foil) over the first metal layer, and bonding portions of the first metal layer to the second metal layer, e.g., using a laser. The metal seed layer can include a layer of deposited tin, tungsten, titanium, copper, and/or aluminum. A sputtering process can be used to deposit the metal seed layer. The metal seed layer can have a thickness in a range of 0.05 to 50 μm.

LAMP techniques are applicable for interdigitated back contact (IBC) solar cells and other types of solar cells, including: continuous emitter back contact solar cells, front and/or back contact solar cells having a trench architecture (e.g., where doped regions are separated by a trench/gap or an intrinsic region), thin-film, Heterojunction with Intrinsic Thin layer (HIT) solar cells, Tunnel Oxide Passivated Contact (TOPCon) solar cells, organic solar cells, front contact solar cells, front contact solar cells having overlapping cells or sub-cells (e.g., shingled hypercell solar cells), Passivated Emitter and Rear Cell (PERC) solar cells, mono-PERC solar cells, Passivated Emitter with Rear Locally-Diffused (PERL) cells, 3 or 4 terminal tandem cells, laminates and other types of solar cells. LAMP techniques are also applicable for solar cells having a plurality of sub-cells coupled by metallization structures—sometimes referred to as a multi-diode structure. For example, a groove separates adjacent sub-cells and a metallization, such as foil, connects the adjacent sub-cells together. The groove can be formed by a laser scribe and subsequent cleave to singulate and physically separate one sub-cell from another, thereby forming one or more adjacent sub-cells from a common original solar cell. The metallization structure can physically and electrically connect the sub-cells, where the metallization structure can be located over the groove and span the gap formed by the groove.

An exemplary method of fabricating a solar cell includes forming an intervening layer, for example an anti-reflective coating (ARC) layer, on or above a substrate (on the front and/or back surface). The intervening layer can have openings or holes exposing portions of the substrate. A metal foil can be located over the intervening layer, and in some examples, cause the metal foil to appear to float over the substrate. The metal foil can be exposed to a laser beam in locations over, partially over, offset from and/or adjacent to the openings in the intervening layer. Exposing the metal foil to the laser beam forms a plurality of conductive contact structures electrically connected to the underlying regions of the substrate. Each conductive contact structure includes a locally deposited metal portion that is in electrical connection with the substrate. In a back contact example, the conductive contact structures are located on a back side, whereas a front contact example has conductive contact structures located on both front and back sides. LAMP techniques can be used for one or both of the sides. The intervening layer can be formed to cover the entire front and/or back surface of the substrate, on and/or above the substrate.

An exemplary metal foil is a continuous sheet of metal that can cover the entire substrate, including one or more of the openings in the intervening layer, and extend past all of the edges of the substrate. In another example, the metal foil covers only a portion of the substrate, such as a portion including one or more of the openings in the intervening layer. In this example, the metal foil can be relatively narrow in width and considered a metal ribbon. For the purposes of this disclosure a metal ribbon is considered a metal foil.

Solar cells can include a patterned backsheet, encapsulant and/or colored (pigmented) back encapsulants. The metal foil can be hidden using a masking or cloaking material, such as a tape, that is placed between an edge of the solar cell and the metal foil, in a gap region between adjacent solar cells (spanning the gap therebetween). The metal foil can also be anodized or otherwise colored to match the solar cell so that it is not readily visible or distinguishable from the solar cell when viewed from the front (i.e., the metal foil is masked or cloaked). The metal foil can also include an adhesive, for example, to adhere the metal foil to the substrate for pre-LAMP processing and/or post-LAMP processing. Alternatively or in addition to, the substrate includes an adhesive to secure the metal foil pre-LAMP processing and/or post-LAMP processing. A dielectric material, for example, a damage buffer material (DBM), or oxide material can also be disposed between the substrate and the metal foil.

A locating process can be performed to position or secure the metal foil to a substrate using a vacuum and/or a tacking process to hold the metal foil in place over/on the substrate. The locating process can include thermocompression, where a roller and/or heat can be used to position or locate the metal foil over the substrate. A vacuum process, thermocompression process or other similar process can also be used to uniformly position the metal foil and inhibit air gaps or air pockets between the metal foil and the substrate.

In an example, the power, wavelength and/or pulse duration of a laser for a LAMP technique are selected so as to form a plurality of locally deposited metal portions, but not to fully ablate the foil. The power, wavelength and/or pulse duration can be selected/tuned based on the metal foil composition, melting temperature and/or thickness. In an example, the laser has a wavelength of between about 250 nm and about 2000 nm (such as wavelength of 250 nm to 300 nm, 275 nm to 400 nm, 300 nm to 500 nm, 400 nm to 750 nm, 500 nm to 1000 nm, 750 nm to 1500 nm, or 1000 nm to 2000 nm), the laser peak power is above $5 \times 10^{-4}$ $W/mm^2$, and the laser is a pulse laser with a pulse frequency of about 1 kHz and about 10 MHz (such as about 1 kHz and about 10 MHz, such a 1 kHz to 1000 kHz, 500 kHz to 2000 kHz, 1000 kHz to 5000 kHz, 2000 kHz to 7500 kHz, or 5000 kHz to 10 mHz. The pulse duration can be between 1 fs to 1 ms, such as 1 fs to 250 fs, 100 fs to 500 fs, 250 fs to 750 fs, 500 fs to 1 ns, 750 fs to 100 ns, 1 ns to 250 ns, 100 ns to 500 ns, 250 ns to 750 ns, 500 ns to 1000 ns, 750 ns to 1500 ns, 1000 ns to 5000 ns, 1500 ns to 10000 ns, 5000 ns to 100000 ns, 10000 ns to 500000 ns, and 100000 to 1 ms. The laser can be an IR, Green or a UV laser. In certain examples, the laser beam has a width of between about 20 μm and about 50 μm, such as 20-30 μm, 25-40 μm, and 30-50 μm.

In an example, non-locally deposited portions of the metal foil are removed, which can result in the locally deposited portions of the metal foil having an edge feature, such as an edge feature formed by physically separating, breaking or tearing the bulk metal foil that was not subjected to a LAMP technique, from the portions of the metal foil that are deposited on the substrate. The edge feature can include a torn edge or a sharp torn edge. In an example, first portions of the metal (aluminum foil in this example) are deposited or directly secured to the surface of the solar cell by a LAMP technique, whereas second portions (which are adjacent to the first portions) of the metal are not subjected to a LAMP technique and are not deposited or directly secured to the surface of the solar cell. The first and second portions of the metal foil are attached to each other, and a region therebetween can be patterned to weaken this region, preferably the same LAMP technique in a same process step that deposited the first portions. The second portions are removed and physically separated or torn away from the first portions, resulting in an edge structure along sides of the first portions. This edge structure or feature can be sharp and/or torn in appearance, and is differentiated from a round or curved edge of a metallization feature left behind from welding, soldering, plating or other depositions of metal to a substrate. The edge structures can also be polished to remove sharp or rough features in a subsequent step.

Exposing foil to a laser beam can also form other features that are unique when compared to conventional metallization approaches, including forming a "U-shaped" structure or valley where the laser beam has contacted the foil. The width of the "U-shaped" is approximately equal to the width of the laser beam used. In an embodiment, the conductive contact structures are connected, at least temporarily until the removal of the regions not exposed to the laser beam, by edge portions that extend from the conductive contact structure to regions of the metal foil not exposed to the laser beam In an example, exposing the metal foil to the laser beam forms a spatter or sputter feature on the solar cell, for example on the foil and/or substrate. Such a spatter feature can be used to determine if the solar cell was formed using a LAMP technique. In some examples, the spatter feature can be removed from at least the metal foil, for example, to facilitate bonding of a second material to the foil, such as a carrier sheet used to remove the foil that has not been exposed to the laser beam, or other components of a solar cell, solar cell string, or higher order structure, such as an interconnect, foil extending from another cell, or other electrically or non-electrically connected component of a solar cell, solar cell string, or higher order structure. Such spatter can be removed by polishing or etching.

Laser assisted metallization can be repeated to build up a multi-layer metal foil structure for purposes of increases metal thickness (e.g., for conductivity or structural purposes) and to facilitate removal of non-deposited portions of a first metal foil layer. Specifically, a second metal source, such as a metal foil, wire, or tape can be located over a first metal foil, where the second metal source can be subjected to a laser beam in selected locations over positions of the first metal foil that are not locally deposited (i.e., directly electrically connected) to semiconductor regions, thereby welding or bonding the second metal source to the first metal foil. Subsequent mechanical removal of the second metal source thereby selectively removes regions of the first metal foil that are not locally deposited to semiconductor regions on the substrate.

Additionally, the second metal source is used to provide additional metallization thickness to an entire or portions of a solar cell, such as for the construction of busbars where additional metal thickness is beneficial for electric conduction. Here, the second metal source can be bonded to the first metal foil, via a laser, at the selected locations over positions of the first metal foil that are not locally deposited and/or the same or approximately the same positions that the first metal foil is locally deposited to the semiconductor regions. This process can be restricted to interconnection regions between adjacent solar cells or applies across a string of adjacent solar cells.

Additionally, the second metal source is located over the solar cell substrate which includes regions or portion of localized metallization, such as formed from a first metal foil or by conventional metallization techniques. The second metal source is bonded to the localized metallization in selected regions to provide additional metallization in these selected regions. In an example, the second metal source is patterned to both increase metal thickness in some regions and to be used as a carrier sheet to remove non-locally deposited portions of the first metal foil in other regions. A tacking process can be used to bond a second metal source to a first metal foil. A tacking process involves forming an array of point or spot welds, which can be performed using a laser, thermocompression bonding (e.g., by using spikes, a spiked roller, a porcupine roller, or a bed of nails), or conventional soldering and welding techniques. The second metal source can also be bonded to the first foil using an electrically conductive adhesive. In another embodiment, the carrier is a plastic, polymer, and/or membrane, that can be used as an insulator, moisture barrier, protection layer and the like.

FIGS. 1A-1D illustrate cross-sectional views of an exemplary solar cell at various operational steps in a method of fabricating the solar cell.

Referring to FIG. 1A, an intervening layer 102 is formed on or above a solar cell substrate 100. Intervening layer 102 has openings 104 therein. While particular reference is made to forming the intervening layer on or above the substrate it is appreciated that the direction above is relative and that this intervening layer can be formed on the back, the front, or even the back and the front, of a selected substrate, for example, for metallization of the front, back, or both the front and back of the substrate.

Intervening layer 102 is formed either with openings 104 (e.g., patterned as deposited) or openings 104 are formed in a blanket-deposited intervening layer. In the latter case, in one embodiment, openings 104 are formed in intervening layer 102 by patterning with laser ablation and/or a lithography and etch process.

Intervening layer 102 can be formed on a backside of substrate 100 opposite a light-receiving side 101 of the substrate 100. Passivation and/or intervening layers (e.g., ARC) can also be formed on the back side of the substrate 100. Specifically, the intervening layer 102 can be a back anti-reflective layer (BARC).

The light receiving surface 101 can have a texturized light-receiving surface. A hydroxide-based wet etchant can be employed to texturize the light receiving surface 101 of the substrate 100. A texturized surface is one which has a regular or an irregular shaped surface for scattering incoming light, decreasing the amount of light reflected off of the light receiving surface 101 of the solar cell. Passivation and/or insulating (e.g., ARC) layers can be formed on the light-receiving surface 101.

While this disclosure is primarily directed to back-contact solar cells, the methods and techniques discussed herein, and specifically the LAMP techniques, can be applied to the metallization of a substrate in other solar cell types, such as front contact solar cells (e.g., PERC solar cells, mono-PERC solar cells, HIT solar cells, TopCon solar cells, PERL cells, and tandem cells, and other types of solar cells).

The openings 104 in intervening layer 102 can expose portions of a plurality of semiconductor regions formed in or above the substrate 100, including portions of a plurality of first semiconductor regions and second semiconductor regions formed in ©r above the substrate 100 (e.g., N-type and P-type semiconductor regions or vice versa). The substrate 100 can include a monocrystalline silicon substrate, such as a bulk single crystalline N-type doped silicon substrate, or a layer, such as a multi-crystalline silicon layer, disposed on a monocrystalline solar cell substrate. The substrate 100 can have disposed therein/thereon N-type doped regions and P-type doped regions, portions of which are exposed by openings 104 in intervening layer 102. In a front contact solar cell implementation, the semiconductor regions on one side of the solar cell can be of the same conductivity type (e.g., P-type or N-type).

The N-type and/or P-type semiconductor regions can be disposed on a dielectric layer, such as a tunneling oxide layer including silicon oxide having a thickness of approximately 2 nanometers or less. The N-type and/or P-type semiconductor regions can be formed from polycrystalline silicon formed by, e.g., using a plasma-enhanced chemical vapor deposition (PECVD) process. The N-type polycrystalline silicon emitter regions can be doped with an N-type impurity, such as phosphorus, and the P-type polycrystalline silicon emitter regions can be doped with a P-type impurity, such as boron. In an embodiment, the N-type and P-type semiconductor regions are separated from one another. In an example, the N-type and P-type semiconductor regions have trenches or intrinsic (or lightly doped) regions formed there between. Trenches can extend partially into the substrate, and by covered by intervening layer 102. Lightly doped regions can have a doping concentration substantially less than the N-type and P-type semiconductor regions. The dielectric layer, e.g., a tunnel oxide or silicon dioxide layer, can be located between the N-type and P-type semiconductor regions and the substrate 100, and can be located laterally between the N-type and P-type semiconductor regions.

Figure 1B:
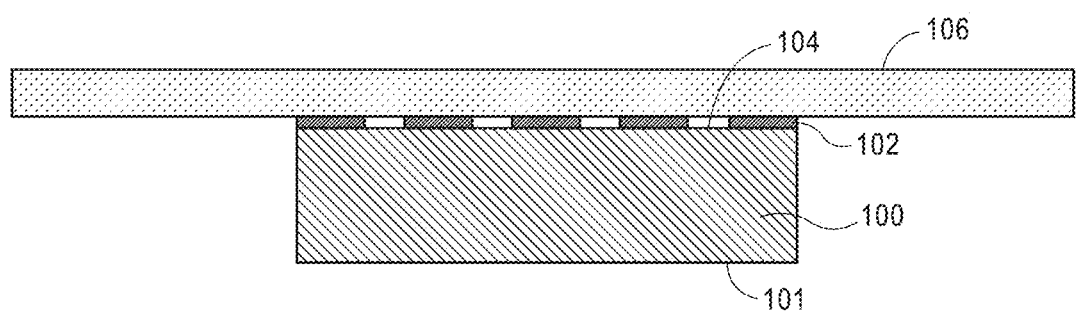

Referring to FIG. 1B, a metal foil 106 is located over the intervening layer 102. In an embodiment, locating the metal foil 106 over the intervening layer can include positioning the metal foil over the substrate 100. In an example, positioning the metal foil 106 over the substrate 100 can include covering the entire substrate 100. In an embodiment, portions of the metal foil 106 can be located over the substrate 100 and other portions can be located away, e.g., extend away from the substrate 100 in a lateral direction as shown in FIG. 1B. In an embodiment, in order to secure the metal foil 106 with the substrate 100, a locating process can be performed, including using a vacuum and/or a tacking process to hold the metal foil 106 in place over the substrate 100. In an example, the locating process includes performing a thermocompression process. In further example, a roller can be used to position or locate the metal foil 106 over the substrate 100. In an embodiment, the vacuum process, thermocompression process or other similar process can uniformly position the metal foil to inhibit air gaps or pockets of air between the metal foil and the substrate, as shown. In an example, a roller can be used to uniformly position the metal foil 106 over the substrate 100.

At the time of locating the metal foil 106 over the substrate 100, the metal foil 106 can have a surface area substantially larger than a surface area of the solar cell. In another embodiment, however, prior to placing the metal foil 100 over the solar cell, a large sheet of foil can be cut to provide the metal foil 106 having a surface area substantially the same as a surface area of the substrate 100. The metal foil can be laser cut, water jet cut, and the like, for example, prior to or even after placement on or above the substrate 100.

In an embodiment, the metal foil 106 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil can be an anodized aluminum foil. In another embodiment, the aluminum foil is not anodized.

Figure 1C:
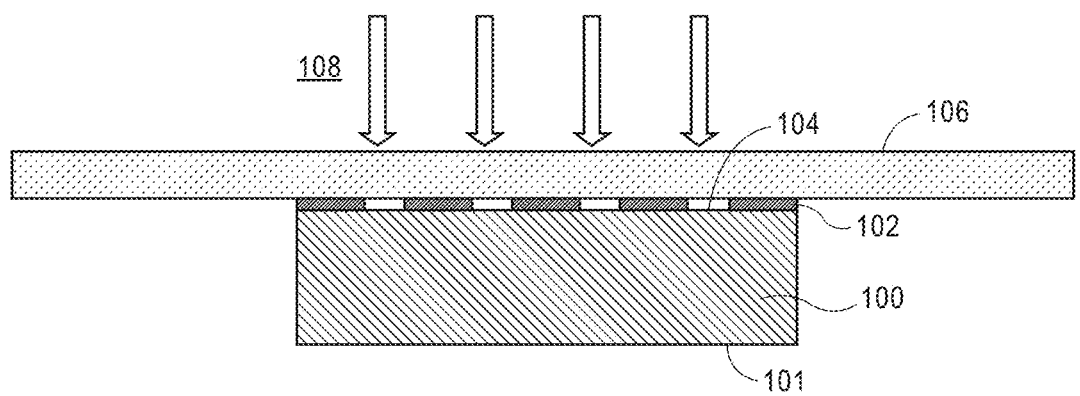

Referring to FIG. 1C, the metal foil 106 can be exposed to a laser beam 108 in locations over the openings 104 in the intervening layer 102 exposing portions of the semiconductor regions in or above the substrate 100. In an embodiment, regions of the metal foil 106 are selectively exposed to a laser beam 108 in locations at least partially over the openings 104 in the intervening layer 102. In some embodiments, the metal foil 106 is exposed to a laser beam 108 in locations offset, e.g., partially over or not over, the openings 104 in the intervening layer 102. In an example, the metal foil 106 is exposed to a laser beam 108 in locations adjacent to the openings 104.

Figure 1D:
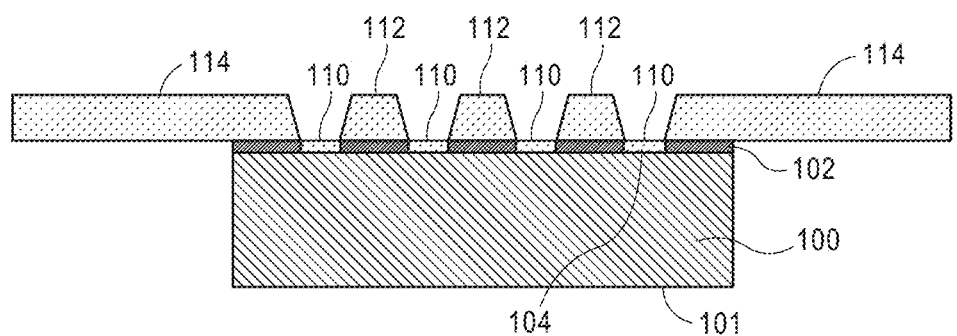

Referring to FIG. 1D, exposing the metal foil 106 to the laser beam 108 forms a plurality of conductive contact structures 110 electrically connected to the semiconductor regions in or above the substrate 100.

In accordance with one or more embodiments of the present disclosure, each conductive contact structure 110 is or includes a locally deposited metal portion. In one such embodiment, metal foil 106 acts as source or metal and is referred to as a local source since the metal foil 106 is first placed on a substrate surface. The metal foil 106 is then exposed to a laser process, e.g., exposure to a laser beam, that deposits metal from the metal foil 106 (metal source) onto portions of the substrate. It is to be appreciated that the resulting locally deposited metal portions can have an edge feature which can be distinguished from metal structure formed by other deposition processes such as plating, welding, or thermal bonding which can provide conformal structures absent an edge feature.

Figure 1E:
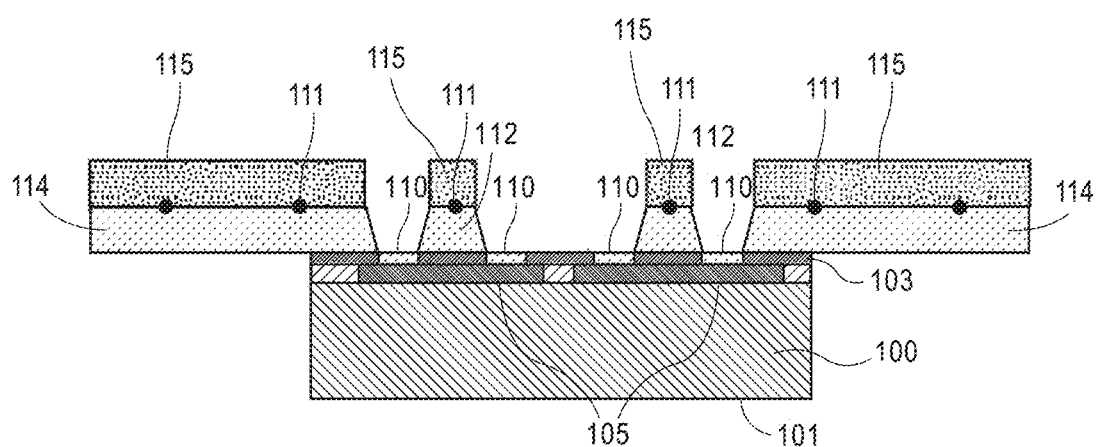

Referring again to FIG. 1D, second portions or portions 112 and 114 of the metal foil 106 not exposed to the laser beam 108 are retained on the intervening layer 102. The portions 112 are central portions, while the portions 114 are edge portions and can be overhang portions, as is depicted. In certain implementations, such second portions are not deposited or secured to the solar cell or the intervening layer 102. In an embodiment, the structure of FIG. 1D is implemented as a solar cell without removal of portions 112 and/or 114 of the metal foil 106. Such a structure can be used for a back surface metallization of a front contact solar cell. Additionally, a second metal source can be bonded/attached to the portions 112, 114 as shown in FIG. 1E. The overhang of edge portions 114 can be used for coupling to another solar cell to form a solar cell string, see for example FIG. 1F. It is to be appreciated that 114 in FIG. 1D can extend to the side of the wafer to connect to a busbar which is into or out of the page (e.g., considering 110, 112 extend into or out of the page and a busbar can be connected to those portions). With reference to again to FIGS. 1A-1F, the process described can be repeated with successive foils to form conductive contact structures on different portions of the substrate, such as a second, third, etc. portions or regions of the substrate, each of which is a discrete region on the substrate.

Referring to FIG. 1E, a second metal source 115 can be located over the substrate 100. The second metal source can include as a metal foil, wire, or tape. As shown, the second metal source 115 can be patterned, e.g., pre-patterned and located over portions 112, 114. In some examples, the second metal source 115 can be located as a sheet and patterned after placing it over the portions 112, 114. A bonding process can be performed to bond the second metal source to the portions 112, 114. In an example, the second metal source 115 can be subjected to a laser beam in selected locations over portions 112, 114, e.g., performing a welding process to bond 111 the second metal source 115 to the portions 112, 114. In some examples, attaching the second metal source 115 can include applying a conductive adhesive, tacking, stamping and/or any other similar attachment-type of processes to connect the second metal source 115 to the portions 112, 114. In an example, the second metal source 115 can be bonded 111 to both portions 112. In some examples, the second metal source 115 can be bonded 111 to portion 112 or 114. Also, in some embodiments, the second metal source can instead be located and/or bonded to the metal foil 106 of FIG. 1D. Also shown are semiconductor regions 105.

Figure 1F:
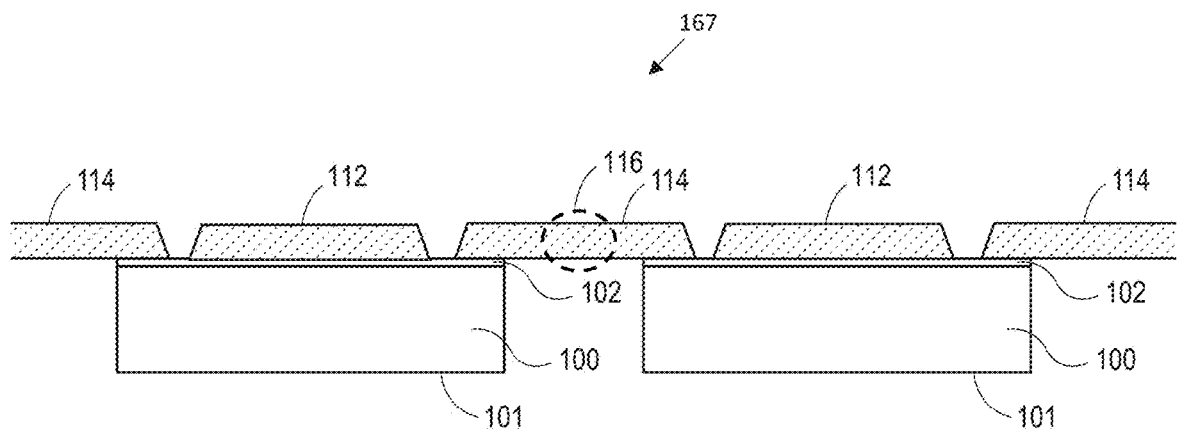

Referring to FIG. 1F, a side elevation view 90° into the page from FIG. 1D, there is shown a solar cell string 167. As shown, the edge portions 114 can also be referred to as interconnect portions which can electrically connect one solar cell to another solar cell. In one example, coupling one solar cell to another solar cell in this manner can form a solar cell string, achieving a parallel or series electrical relationship between the cells. In a particular embodiment, the overhang portion can represent a foil portion that is sufficiently large to overlap with one or more additional cells for metallization of the one or more additional cells. In an example, a single piece and/or sheet of foil can be used for a plurality of solar cells (e.g., 2, 3 or more solar cells) in this manner. In an embodiment, two or more cells can be connected together by their respective edge portions 114. For example, the edge portions 114 from adjacent cells can be connected by various processes at 116, such as by bonding, e.g., welding, and/or including conventional and laser bonding, laser welding, thermocompression bonding, soldering processes, and the like. In another example, substrates 100 can have individual edge portions 114. These individual edge portions 114 can be bonded and/or welded together to electrically connect one substrate to another, e.g., to form a solar cell string. In some examples, the individual edge portions 114 can be attached together using a conductive adhesive, tacking process, stamping process and/or any other type of applicable attachment process.

Figure 1G:
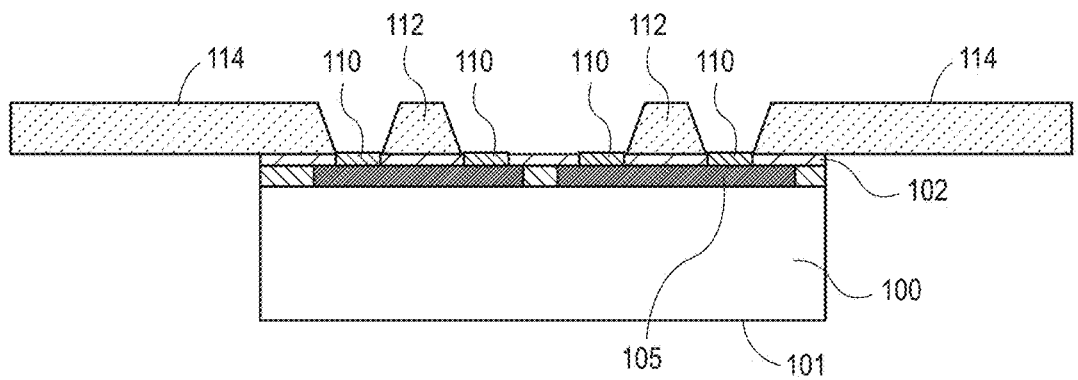

Referring to FIG. 1G, this figure schematically illustrates position of semiconductor regions 105. In an embodiment, as shown, the semiconductor regions can include a plurality of semiconductor regions such as first semiconductor regions, second semiconductor regions, etc. In an example, first semiconductor regions can be N-type semiconductor regions and the second semiconductor regions can be P-type semiconductor regions. In some examples, the semiconductor regions 105 can have the same conductivity type, e.g., are all N-type or P-type, as in some front contact solar cells. In an embodiment, the semiconductor regions 105 can include polycrystalline silicon. A thin dielectric layer, e.g., a tunnel oxide layer, can be disposed between the semiconductor regions 105 and the substrate 100.

As illustrated in FIG. 1G, the semiconductor regions 105 are separated from one another laterally by a region 119. This region 119 can be a gap, an intrinsically doped region or a lightly doped region. Two openings in the intervening layer 102 for each of the semiconductor regions 105 are shown for connecting the conductive contact structures 110 to the semiconductor regions 105. The portions 112 electrically connect the conductive contact structures 110 for each of the semiconductor regions 105. In other words, the portion 112 on the left electrically connects the two left-most conductive contact structures 110 while the portion 112 on the right electrically connects the two right-most conductive contact structures 110. In specific example, the semiconductor regions 105 are N-type and/or P-type semiconductor regions and are separated by trenches formed there between, the trenches extending partially into the substrate, and covered by intervening layer 102. The separation can also be achieved by a lightly doped region 119, where the lightly doped regions can have a doping concentration substantially less than the N-type and/or P-type semiconductor regions. However, the semiconductor regions 105 can have the same conductivity type, are all N-type or P-type, as in some front contact solar cells. The portions 114 are edge portions and can be overhang portions, which can be used for coupling to another solar cell.

Figure 1H:
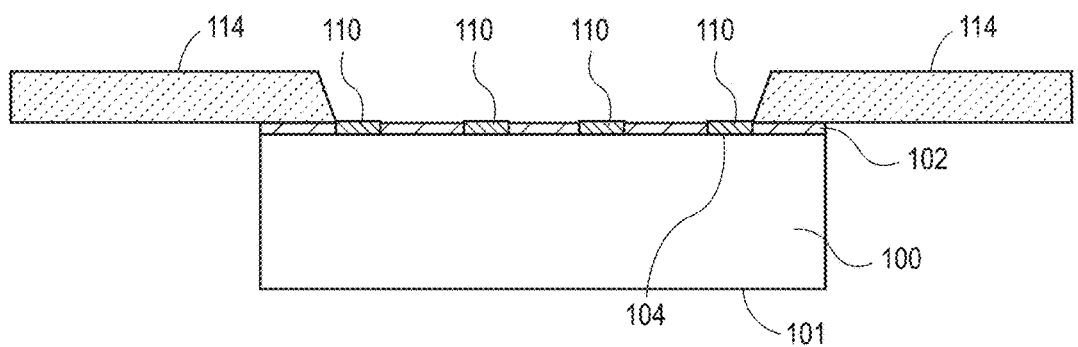

Referring to FIG. 1H this figure schematically illustrates position of semiconductor regions 104. In an embodiment, as shown, the semiconductor regions 104 can include portions of the substrate 100 itself. Similar to FIG. 1G, the semiconductor regions 104 can include a plurality of semiconductor regions: first semiconductor regions, second semiconductor regions, etc, which can be N-type semiconductor regions and P-type semiconductor regions. In some examples, the semiconductor regions 104 can have the same conductivity type, e.g., are all N-type or P-type, as in some front contact solar cells.

Referring again to FIGS. 1G and 1H, a second metal source can be bonded and/or attached to the portions 112, 114. The second metal source can include as a metal foil, wire, or tape. In an example, the bond and/or attachment can include a weld, laser, weld, conductive adhesive, tack, stamp and/or any other similar bond/attachment.

Figure 2:
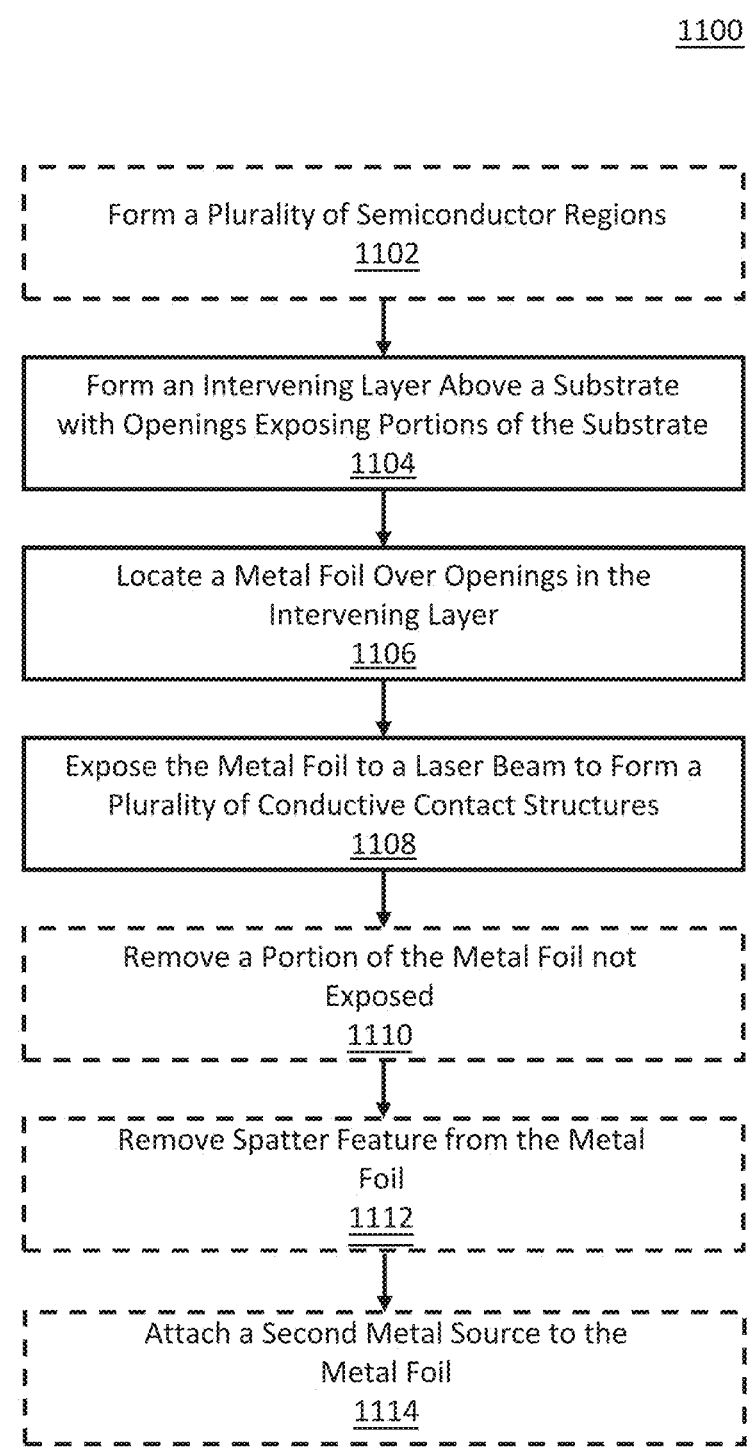
FIG. 2 illustrates an exemplary work flow for constructing a solar cell.

FIG. 2 is a flowchart 1100 representing various operations in a method of fabricating a solar cell. Optionally, at operation 1102, a plurality of semiconductor regions are formed in or above the substrate. At operation 1104, an intervening layer is formed above a substrate. In an example, the intervening layer can have openings exposing portions of the substrate. These openings can be formed by laser ablation or etching. At operation 1106, a metal foil is located over the openings in the intervening layer. At operation 1108, the metal foil is exposed to a laser beam to form a plurality of conductive contact structures electrically connected to exposed portions of the substrate and also to pattern the metal foil. Optionally, at operation 1110, at least a portion of the metal foil is removed. Optionally or in addition to, at operation 1112 a spatter feature is removed from the metal foil not exposed to the laser beam. The operation 1112 can be performed prior to operation 1110. Optionally or in addition to, at operation 1114 a second metal source, such as a metal wire, foil or tape, conductive material can be attached to the metal foil. The second metal source can be to the conductive contact structures described above with respect to operation 1108. Operation 1114 can be performed prior to operation 1110. Operation 1114 can be performed prior to or after operation 1112. The operations described above can be repeated, for example with successive foils.

Figure 3A:
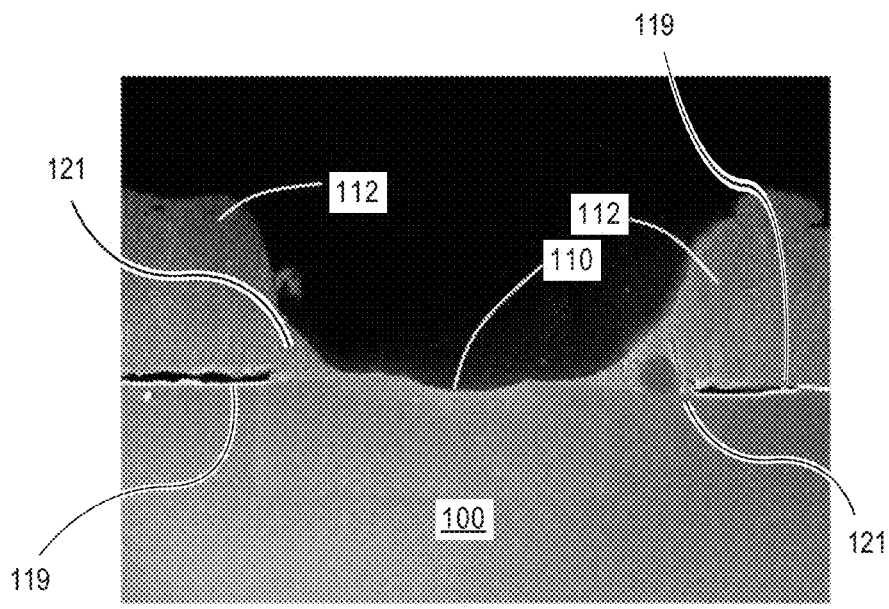
FIGS. 3A and 3B include digital images of cross-sectional views of a solar cell.
Figure 3B:
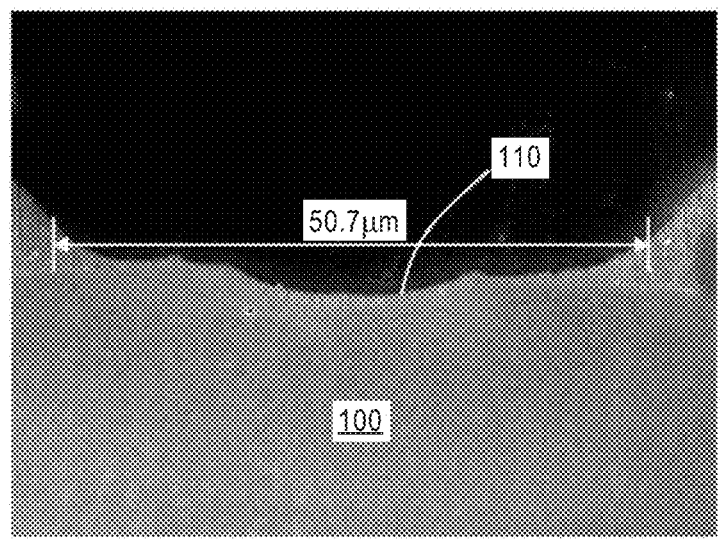

An exemplary structure of a LAMP technique is depicted in FIGS. 3A and 3B. FIGS. 3A and 3B include digital images of cross-sectional views of a solar cell processed with a LAMP technique. Referring to FIG. 3A, a metal foil was exposed to the laser beam to form a plurality of conductive contact structures 110 or "locally deposited" metal portions, electrically connected to the substrate 100, which can include a plurality of N-type and/or P-type semiconductor regions in or above the substrate 100. On either side of the conductive contact structure 110 are the second portions or portions 112 of the metal foil, which are not locally deposited to the substrate 100. These portions 112 can be retained on the intervening layer 102 above substrate. The portions 112 are central portions as depicted in FIGS. 1A-1H. The conductive contact structures 110 can be connected, at least temporarily, until the removal of portions 112, leaving edge portions 121. The portions 112, edge portions 121 and conductive contact structure 110 form a U-shape. Although, in this view, an edge portion is shown, in some examples an edge portion 121 is not formed.

As portions 112 are not directly connected to the substrate 100, a gap 119 is present between the portions 112 and the substrate 100, which is overlain with an intervening layer (intervening layer 102 as depicted in FIGS. 1A-1H). As can be seen in FIG. 3B, which is a magnification of FIG. 3A, the resulting conductive contact structure 110 or locally deposited metal portion can have an edge feature, such as a sharp or torn edge feature when the second portions or portions 112 are removed, leaving behind at least a portion on the edge portion 121. Such an edge feature can be distinguished from metal structure formed by other metal deposition processes such as by a plating process which can provide conformal structures absent an edge feature.

With reference back to FIGS. 1A-1H, subsequent to exposing the metal foil 106 to the laser beam 108, portions 112 and 114 of the metal foil 106 can be removed, and portions 112 can be selectively exposed to the laser beam. An exemplary structure is depicted in FIGS. 4A-4C.

Figure 4A:
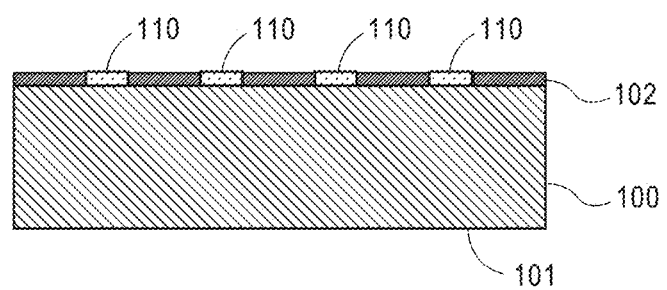
FIGS. 4A-4C illustrate cross-sectional views of a solar cell.
Figure 4B:
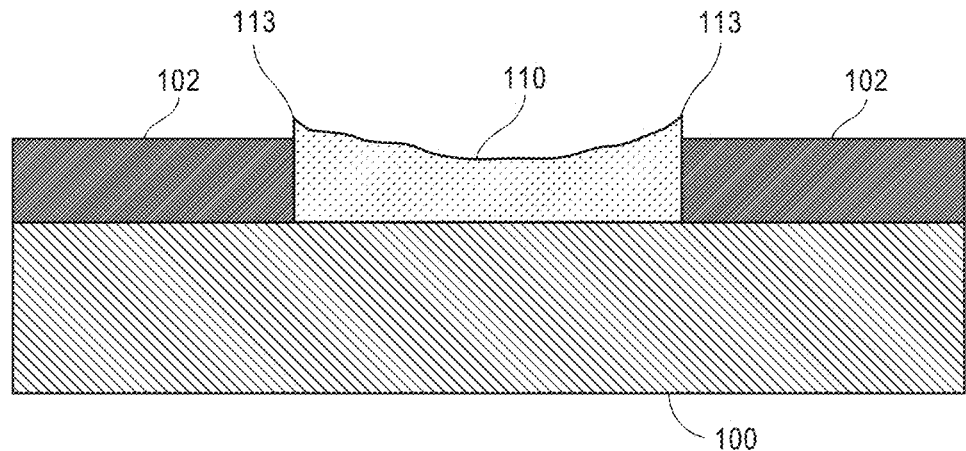
Figure 4C:
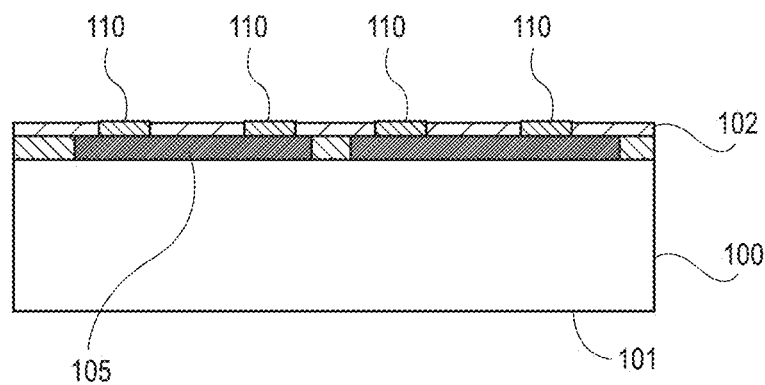

FIGS. 4A-4C illustrate cross-sectional views of a solar cell. As shown in FIG. 4A, removal of the second portions of the metal foil can leave behind the conductive contact structures 110 on the locations in the intervening layer 102 that have exposed portions of the plurality of N-type and/or P-type semiconductor regions in or above the substrate 100. In FIG. 4B, the formation of sharp or torn edge features 113 on either side of the conductive contact structures 110 is shown. These edge features 113, as described above, are formed from the removal the second portions of the metal foil not exposed to the laser beam. With reference to FIGS. 1C, 1D, 1E, 1F, 1G and 1H, in some embodiments, some portions 112 and 114 are removed and other portions 112 and 114 remain. In an embodiment, exposing the metal foil 106 to the laser beam 108 includes removing all or substantially all portions of the metal foil not exposed to the laser beam.

FIG. 4C shows the position of N-type and/or P-type semiconductor regions 105. In the embodiment shown, N-type and/or P-type semiconductor regions 105 are separated from one another, and each semiconductor region has two conductive contact structures 110. Alternatives, not shown, include one, three or more conductive contact structures per semiconductor region. In an example, the N-type and/or P-type semiconductor regions can have trenches formed there between, the trenches extending partially into the substrate, and covered by intervening layer 102. In one example, N-type and/or P-type semiconductor regions can be separated by an intrinsic or lightly doped region there between, e.g., where the lightly doped regions can have a doping concentration substantially less than the N-type and/or P-type semiconductor regions. In some embodiments, the semiconductor regions 105 can have the same conductivity type, are all N-type or P-type, as in some front contact solar cells. It is contemplated that the conductive contact structures 110 can be reinforced with a second metal source as described, as described above.

With reference back to FIGS. 1A-1G, subsequent to applying a laser beam 108 to the metal foil 106, in an example, only portions 114 of the metal foil 106 not exposed to the laser beam 108 are removed, while some portions 112 of the metal foil 106 are retained. In an embodiment, portions 112 can be selectively exposed to the laser beam 108 or a different/subsequent laser beam, which can use the same laser at different laser settings/variables.

Figure 5:
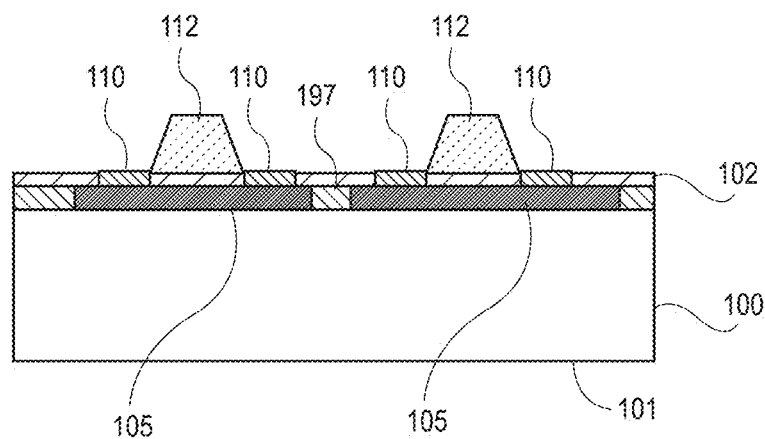
FIG. 5 illustrates cross-sectional views of a solar cell.

FIG. 5 illustrates a cross-sectional view of a solar cell. As shown in FIG. 5, the laser forms the conductive contact structures 110 and portions 112 above the intervening layer 102, such as an ARC or BARC layer. Portions 114 have been removed. The position of N-type and/or P-type semiconductor regions 105. In one example, N-type and/or P-type semiconductor regions are separated, for example by a lightly doped region 197 there between, e.g., where the lightly doped regions can have a doping concentration substantially less than the N-type and/or P-type semiconductor regions. In some embodiments, the semiconductor regions 105 can have the same conductivity type, are all N-type or P-type, as in some front contact solar cells. It is contemplated that the conductive contact structures 110 can be reinforced with a second metal source as described, as described above. It is further contemplated that the portions 112 can be formed from a second metal source as described, as described above.

Figure 6:
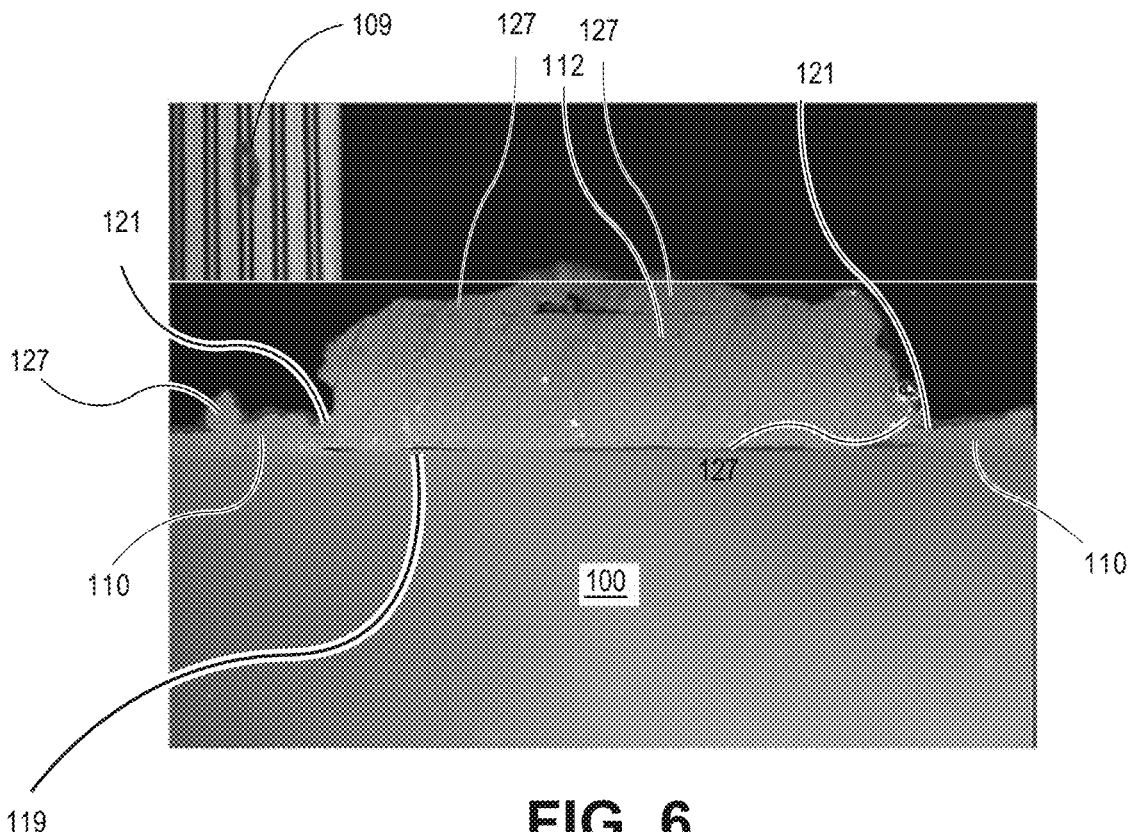
FIG. 6 includes a digital image of cross-sectional views of a solar cell.

FIG. 6 is a digital image of a cross-section of a solar cell subsequent to a LAMP technique. Inset 109 in the upper-left of the digital image shows the region of the solar cell, circled, where the cross-section was taken. In this example, portions 112 of the metal foil 106 are retained. These portions 112 are portions of the metal foil 106 not exposed to the laser beam or exposed to a laser beam having different properties (e.g., power, frequency, etc.). The portions 112 can also be exposed to a different laser beam at subsequent process step. Also, as shown in FIG. 6, the laser forms the conductive contact structures 110 which can be connected portion 112, where portion 112 is located above the substrate 100. In an embodiment, the portion 112 can carry current between conductive contact structures 110. In an embodiment, exposing the metal foil to the laser beam can form a spatter feature 127 on the solar cell. Such a spatter feature can be used to determine if the solar cell was formed using one or more of the laser assisted metallization processes disclosed herein, for example as differentiated from a welding or soldering process. Also, optionally, these spatter features on 112 can be removed by mechanical cleaning such as brush or chemical cleaning, a water jet process, high pressure air blowing process, and mechanically grab and peel can be used to remove the region 112 completely. FIG. 6 further shows a gap 119 that is apparent between the portion 112 and the substrate 100, which is overlain with an intervening layer (see intervening layer 104 as depicted in FIGS. 1A-1H). Also seen in this view is the edge portion 121.

Figure 7A:
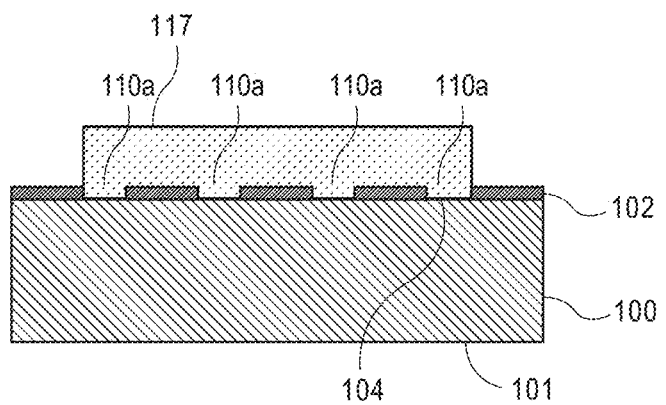
FIG. 7A illustrates a cross-sectional view of a solar cell.

FIGS. 7A-7D illustrate alternative implementations, in which a metal foil forms busbars that run transverse to the conductive contact structures and conduct current across the conductive contact structures. With reference to FIG. 7A, the busbar 117 runs transverse to the conductive contacts and makes contact with the conductive contacts 110a that contact the substrate 100 through openings 104 in intervening layer 102. As shown in the plan view of FIG. 7B, the openings 104 can be in pairs, as shown (e.g., referring to FIGS. 1G, 1H). As shown, the conductive contact structure 131a can be connected to the busbar 117 and the conductive 131b can be connected to an opposite polarity busbar (not shown). The fingers 131a and 131b also can include a portion 112 of the metal foil as shown for example in FIG. 5B. Generally speaking 131a, 131b can include any of the example metallization configurations presented herein. In an example, the metal deposition process can form an ohmic contact between the metal foil and the substrate. In an example, the ohmic contact can be formed between the busbar 117 and conductive contact structures 131a or 131b. It is contemplated that the busbar as described with respect to FIGS. 7A-7D can be formed from the metal foil and/or the second metal source, as described above.

Figure 7B:
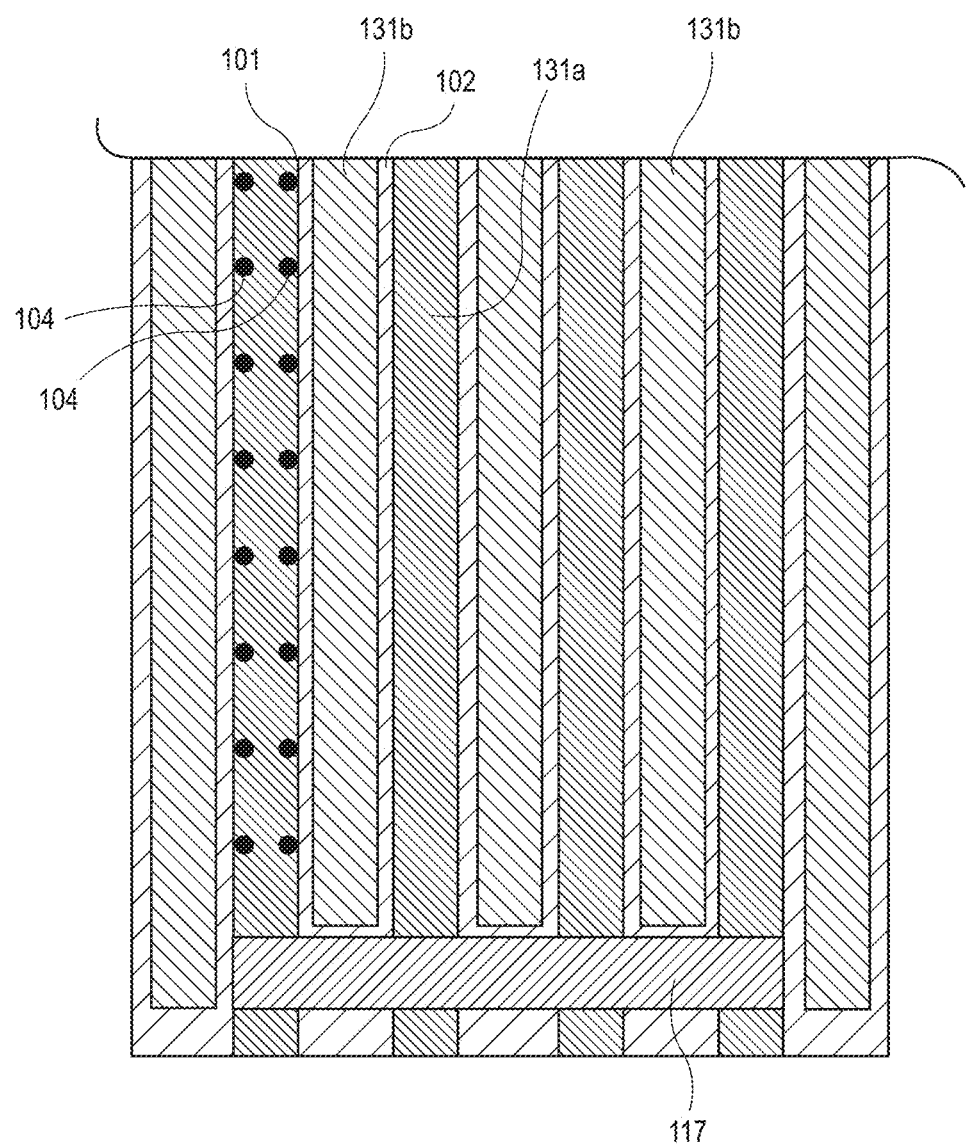
FIGS. 7B-7D each illustrate a plan view of a solar cell.
Figure 7C:
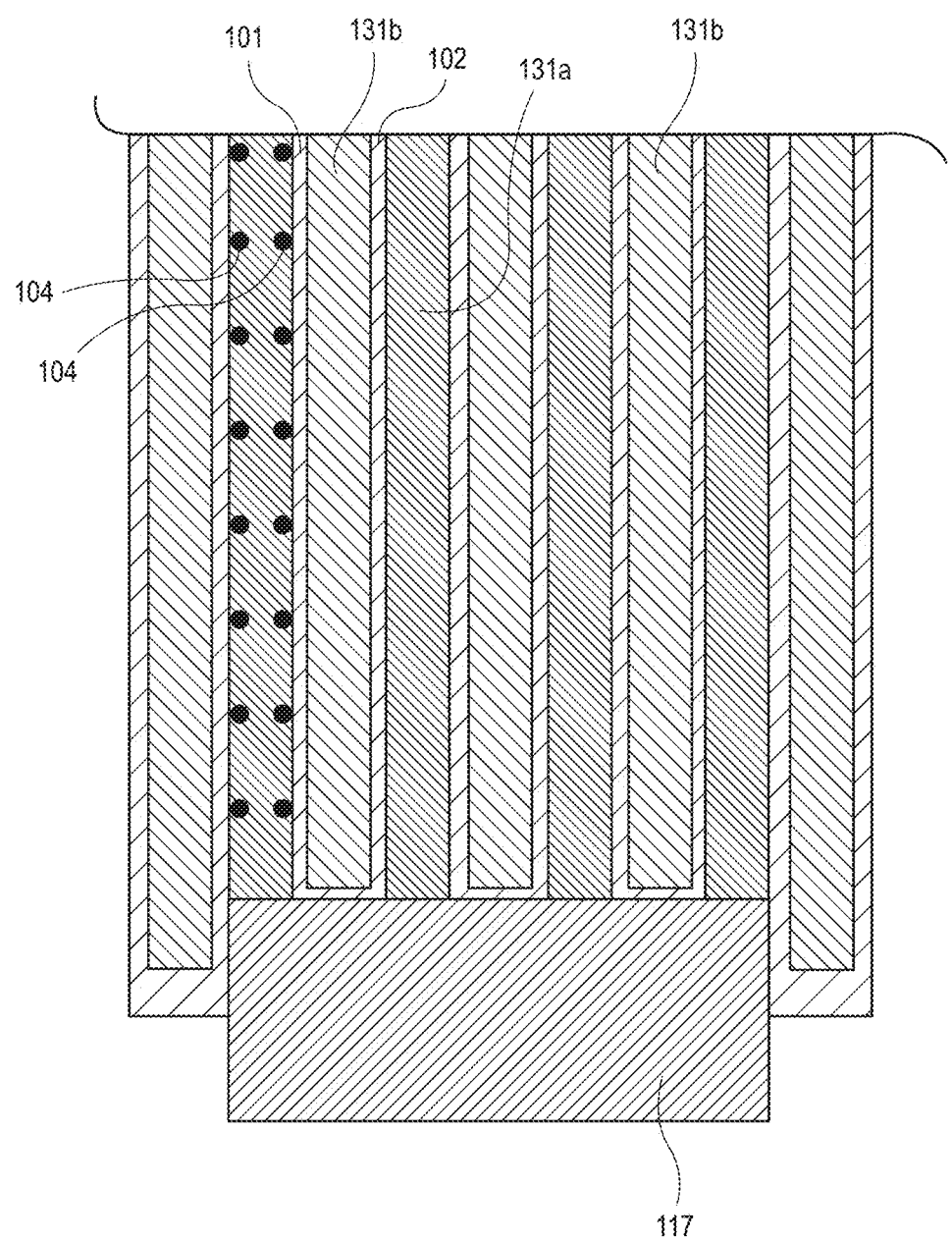

With reference to FIG. 7C, the busbar 117 can have an interconnect portion to electrically connect the busbar 117 of one solar cell to a busbar of another solar cell (not shown). The fingers 131a and 131b can be a locally deposited region, such as described above for. See FIG. 4A. In an example, the metal deposition process can form an ohmic contact between the metal foil and the substrate. In an example, the ohmic contact can be formed between the busbar 117 and conductive contact structures 131a and/or 131b.

Figure 7D:
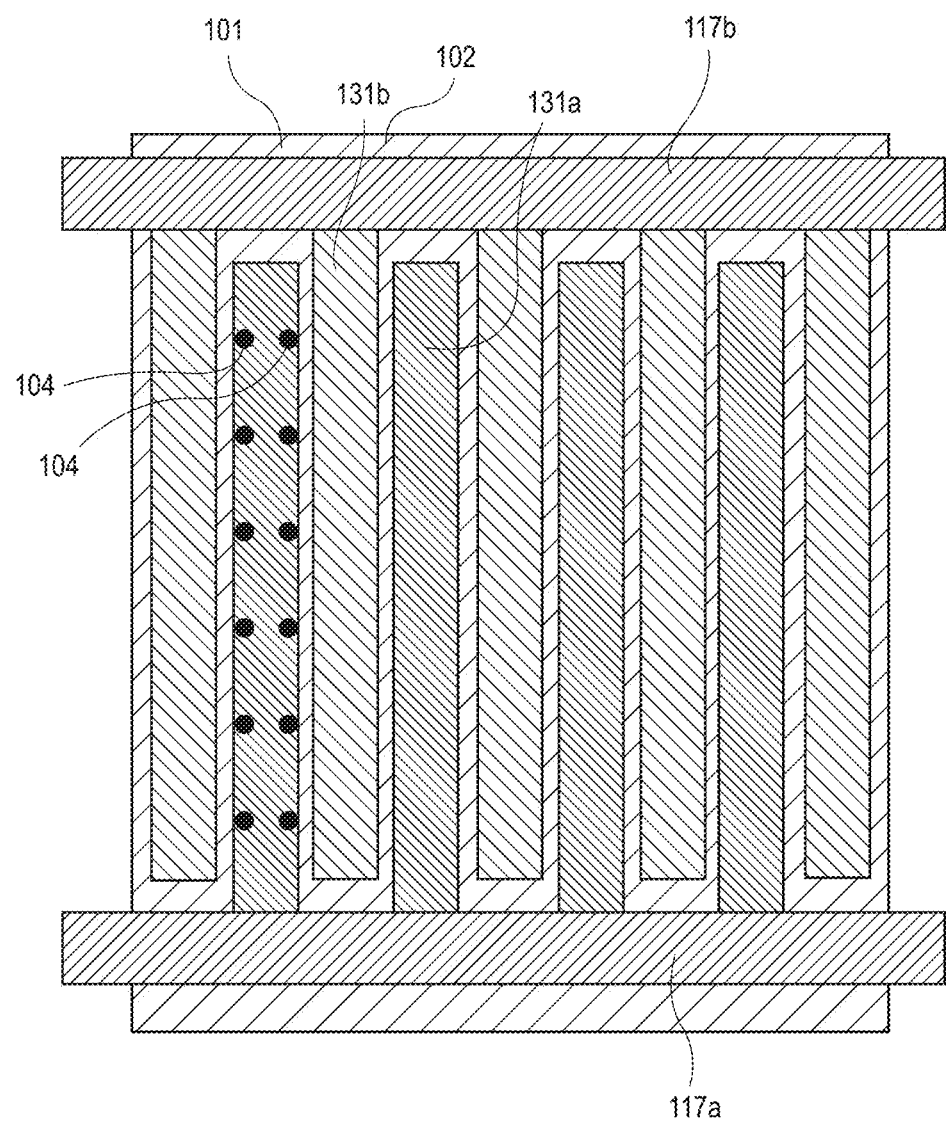

Referring to FIG. 7D, in contrast to that shown in FIGS. 7A-7C, the busbar, in this case busbars 117a and 117b can optionally extend past the edges of substrate 100 as shown in FIG. 7D. In some examples, busbars can be formed on either end of the substrate 100, see, e.g. busbars 117a and 117b. In still other embodiment, a solar cell can have one or more busbars in the middle of the cell. The busbars 117a and 117b can carry current between conductive contact structures 131a, 131b, respectively. In an embodiment, the busbar 117a and 117b can carry current without creating large amount of resistance between conductive contacts 131a, 131b. In an example, the metal deposition process can form an ohmic contact between the metal foil and the substrate. In an example, the ohmic contact can be formed between the busbar 117a and 117b and conductive contact structures 131a and/or 131b.

Figure 8A:
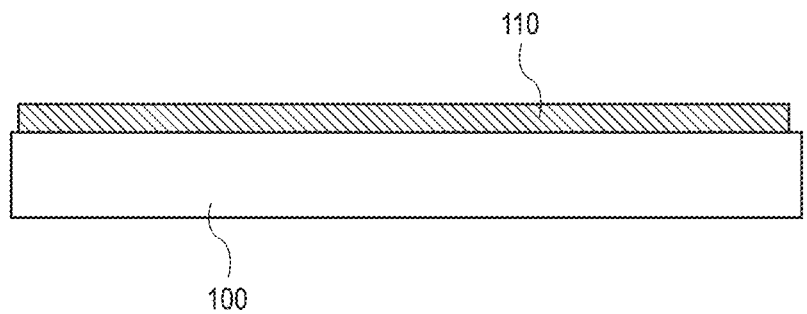
FIGS. 8A-8C illustrate side elevation views of a solar cell.
Figure 8B:
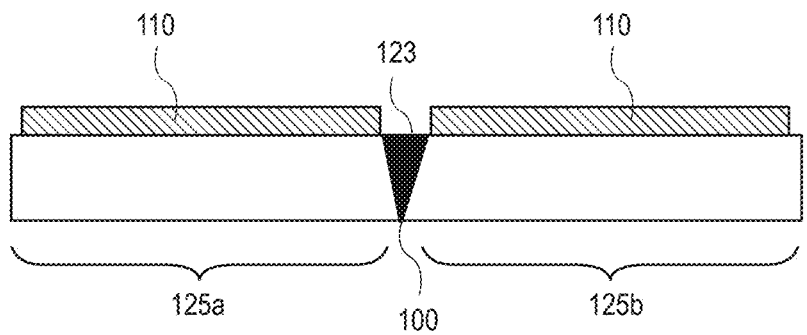
Figure 8C:
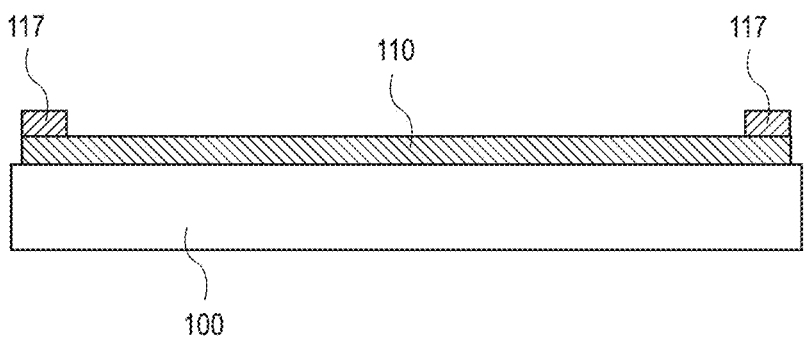

FIGS. 8A-8C show additional examples of a solar cell utilizing a multi-diode technique. FIG. 8A is a side view of a solar cell, in which the conductive contact structures 110 run the length of the substrate 100. FIG. 8B shows a pair of sub-cells 125a and 125b in which the conductive contact structures 110 can run approximately half the length of the substrate 100. In some examples, the conductive contact structures 110 can run approximately ⅓, ¼, ⅕ and/or any fraction of the length of the substrate 100. The conductive contact structures 110 can be formed continuously as shown in FIG. 8A and then laser scribed or otherwise ablated at 123 to from the two sub-cells 125a and 125b. The metal foil 110 can extend over the scribe or ablated portion 123 to electrically and/or mechanically bridge and/or connect the two sub-cells 125a and 125b. Alternatively, they can be formed as separate structures, e.g., with no need to separate or ablate the interconnecting foil. FIG. 8C is a side view of a solar cell, with busbars 117 that run transverse to the conductive contact structures 110 and conduct current across the conductive contact structures 110.

In the various implementations discussed herein, removal of the second portions or portions of the metal foil that are desired to be removed can be accomplished via a mechanical process. The mechanical process can include peeling off the respective portions, thereby separating the second portions from the first portions by tearing or ripping. Laser ablation and chemical etching can also be used to remove the second portions.

Figure 9A:
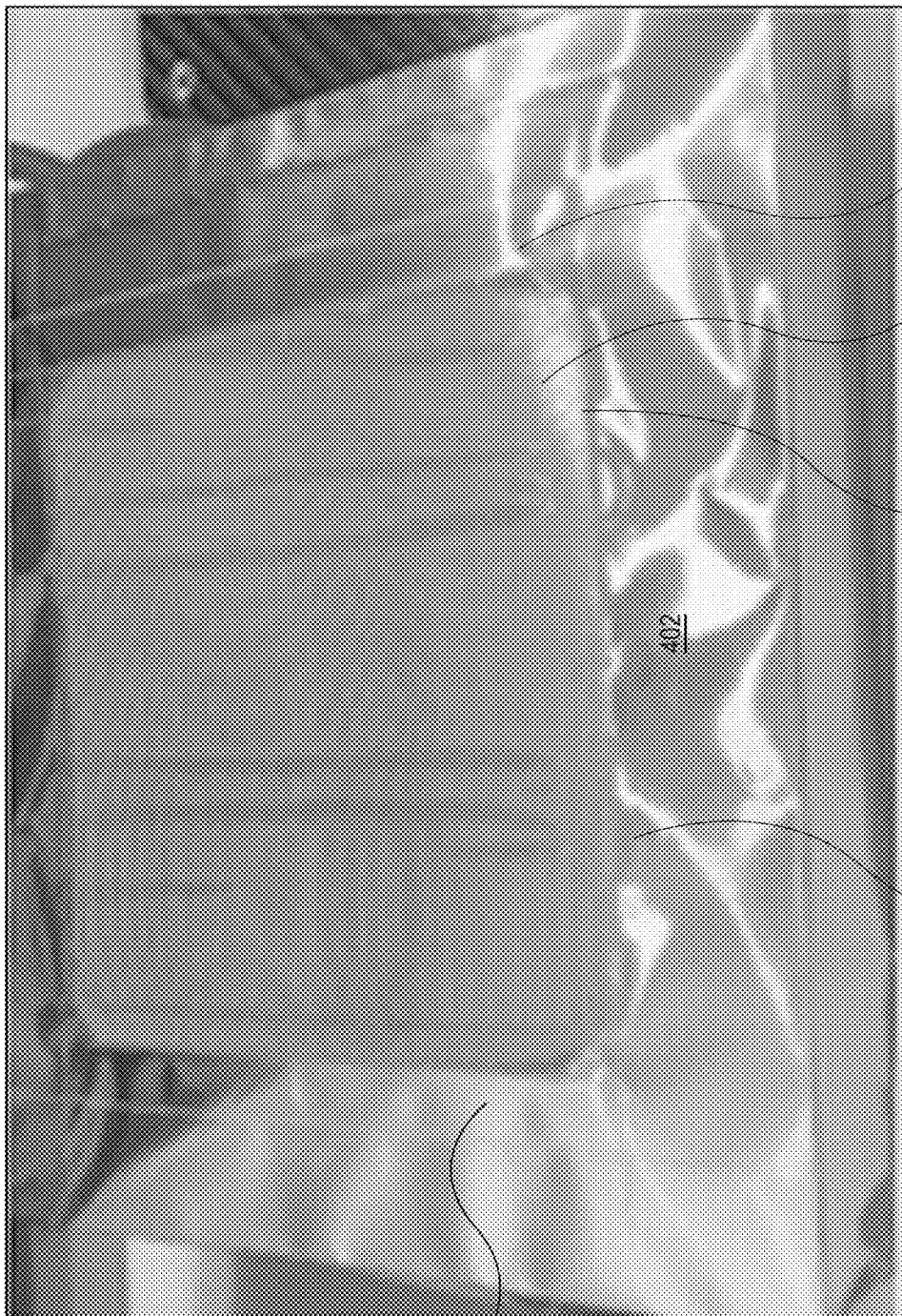
FIGS. 9A-9D are digital images of various operations in a method of fabricating a solar cell.
Figure 9B:
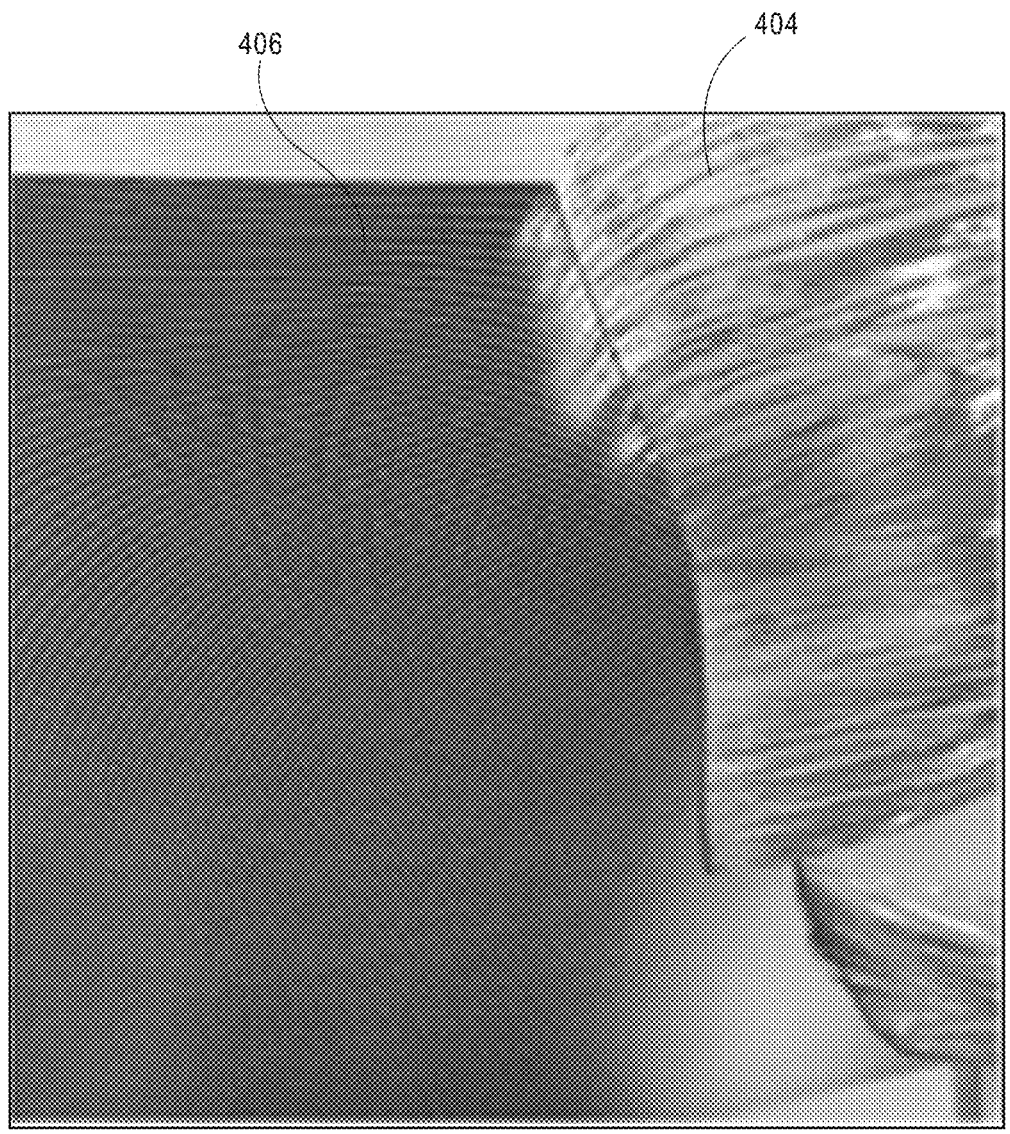
Figure 9C:
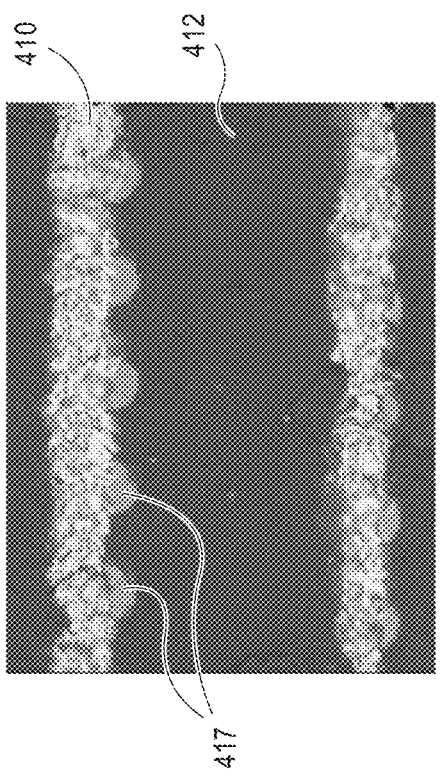
Figure 9D:
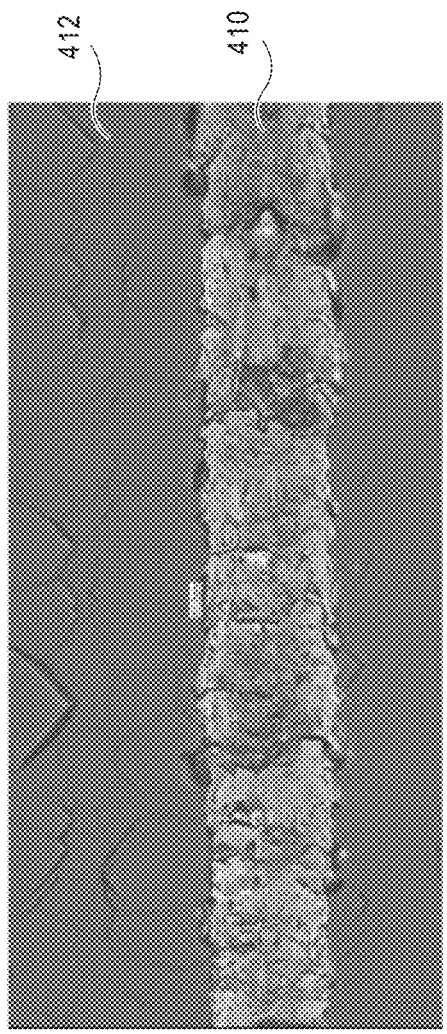

FIGS. 9A-9D include images of various operations in a method of fabricating a solar cell. FIG. 9A, in a first approach, a metal source (e.g., metal foil) was placed or located on a surface of a silicon wafer, and then a laser was used to deposit and pattern the metal foil. That is, metal from the metal foil is locally deposited onto the silicon wafer in locations corresponding to a laser scribe/patterning process. Foil that is not laser scribed (or subjected to the laser) can be subsequently removed as shown in FIG. 9B via a mechanical peeling process. FIGS. 9C and 9D show magnified views of the locally deposited metal portions disposed over the substrate. FIGS. 9A-9D are described in more detail below.

FIG. 9A is a plan view for a setup 400 to place or locate a metal foil 402 over a substrate 406. The setup 400 can include a metal foil 402 placed or fitted over a silicon substrate 406. Portions of the metal foil 402 over the substrate 406 are exposed to a laser beam in locations where openings in an intervening layer expose underlying semiconductor regions. Portions 404 of the metal foil 402 are not exposed to the laser beam. Portions 407 of the metal foil 402 can overhang the silicon substrate 406, as is depicted. In some embodiments, portions 404 can be exposed to another laser beam having different properties (e.g., power, frequency, etc.) at another step. The setup 400 can include a vacuum table to hold the substrate 406 in place and hold the metal foil 402 in place atop the substrate 406 to inhibit air gaps or bubbles in the metal foil 402.

FIG. 9B illustrates portions 404 of the metal foil 402 being removed from substrate 406, e.g., by a peel off process. Specifically, excess portions 404 can be peeled off from the substrate 406. The portions 404 can be portions of metal not exposed to the laser, as described above. Portions 404 can also be exposed to another laser beam having different properties (e.g., power, frequency, etc.) to provide further patterning or ablation. The metal foil can also be removed by blowing (e.g., compressed air), jetting (e.g., using a high-pressure water jet process), applying an adhesive to the portions 404 and pulling of the adhered portions 404, or other metal removal methods.

FIGS. 9C and 9D illustrate an exemplary resulting solar cell structure following the removal of the portions 404 in FIG. 9B. FIGS. 9C and 9D illustrate conductive contacts including metal 410 (e.g., aluminum) remaining as locally deposited (by exposing the metal foil 402 to the laser beam) over openings 417 in the intervening layer 412 of the substrate 406. The locally deposited metal 410 is located over the intervening layer 412, where the intervening layer 412 can be disposed over the substrate 406. The locally deposited metal 410 is located in locations over, partially over, offset from and/or adjacent to the openings in the intervening layer 412. As shown in FIG. 9C, locally deposited metal 410 is partially over or offset from the contact openings in the intervening layer 412 (i.e., partially over or offset from the exposed openings 417 in the intervening layer 412). FIG. 9D illustrates the locally deposited metal 410 aligned with and over the contact openings (not shown—they are covered by the metal 410) the intervening layer 412. FIGS. 9C and 9D illustrate the metal 410 locally deposited on both the intervening layer 412 and the substrate 406 via the openings 417. The intervening layer in such a structure can act as an insulator such that a conductive path is formed to the substrate only via the opening 417. As used here, "substrate" generally refers to a semiconductor region below the intervening layer.

Figure 10A:
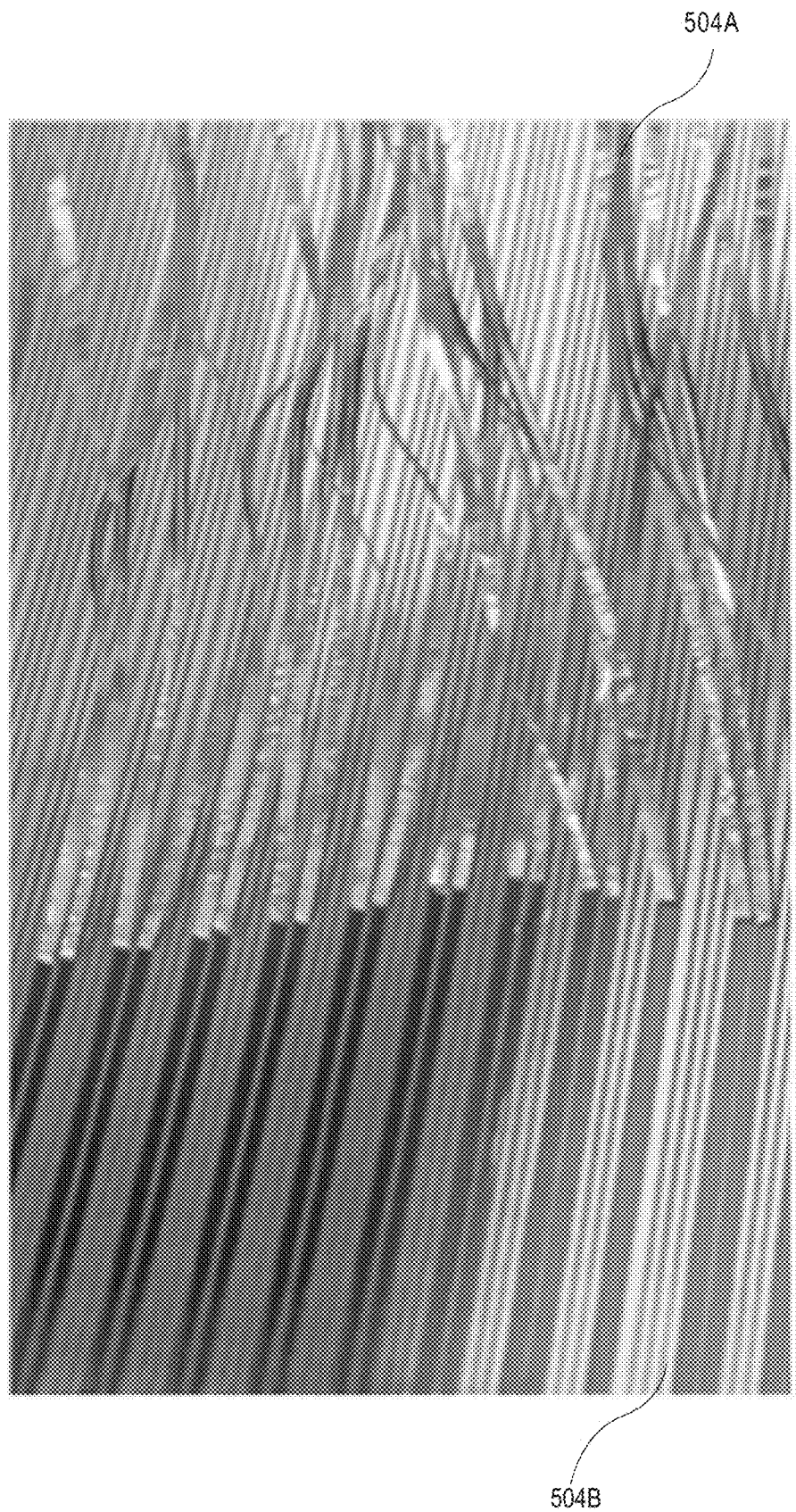
FIGS. 10A and 10B are digital images of various operations in a method of fabricating a solar cell.
Figure 10B:
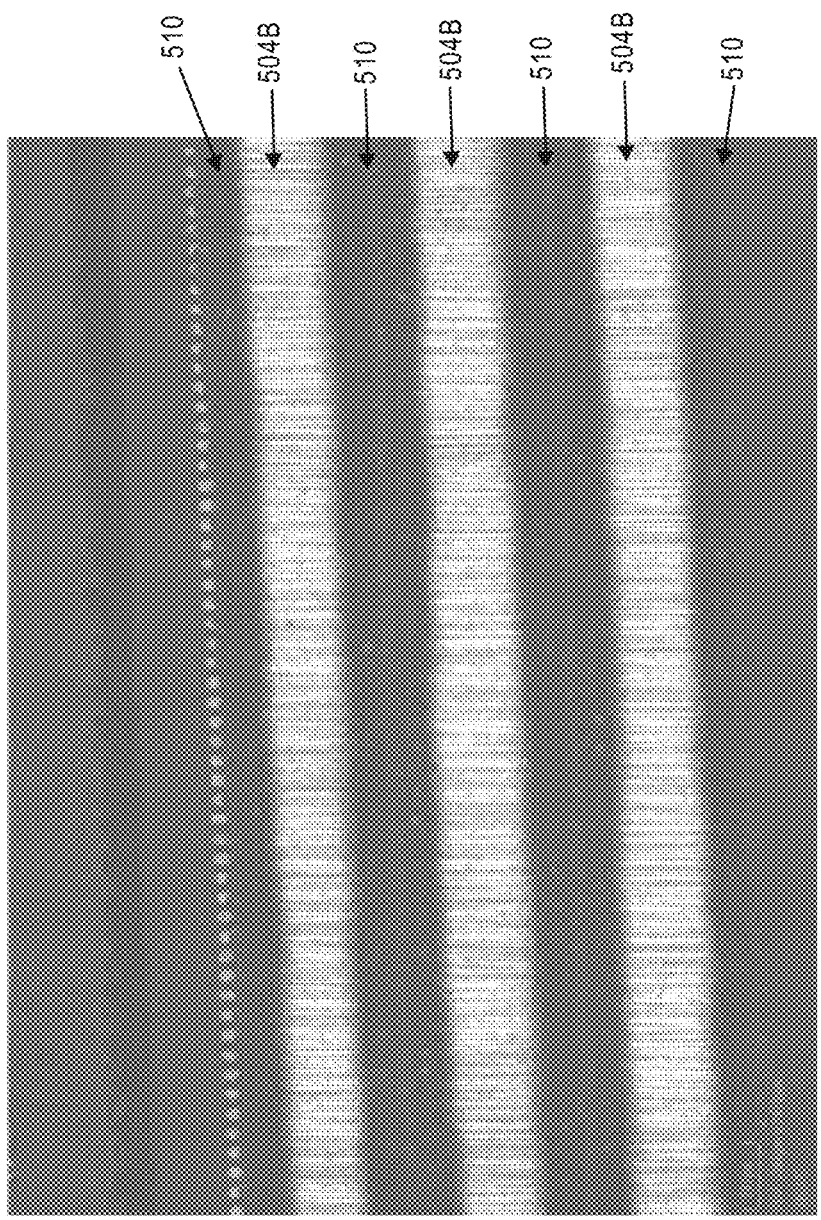

FIGS. 10A-10B are images of various operations in another method of fabricating a solar cell using a LAMP technique.

FIG. 10A illustrates a portion 504A of a metal foil removed from a substrate, where excess portions 504A are peeled off from the substrate.

FIG. 10B illustrates a solar cell structure following removal of the portions 504A of the metal foil 502 from FIG. 10A. Here, however, metal (e.g., aluminum) is locally deposited by a LAMP technique at 510 (for example conductive contact structures 110 in FIG. 1D) and portions 504B of the metal are not exposed to the laser beam but still remaining (for example as 112 in FIG. 1D). These portions 504B that are not exposed to a laser are not removed by a peel off process as per FIG. 10A. On the other hand, these portions 504B remain on the intervening layer between regions 510, where the metal has been removed. Subsequent processing can include exposing portions 504B to the laser beam or to another laser beam having different properties (e.g., power, frequency, etc.).

It is to be appreciated that any of all of the structures illustrated in FIGS. 1A-10B can each represent a partially completed solar cell, as further processing can be performed. Alternatively, any of the structures illustrate a completed solar cell.

FIGS. 11A-11E illustrates example semiconductor substrates fabricated using methods, approaches or equipment described herein, according to some embodiments. The semiconductor substrates are solar cells 1520*a-e* and can include a silicon substrate 1525. The silicon substrate 1525 can be cleaned, polished, planarized and/or thinned or otherwise processed. The semiconductor substrate 1525 can be a single-crystalline or a multi-crystalline silicon substrate, N-type or P-type. The solar cells can have a front side 1502 and a back side 1504, where the front side 1502 is opposite the back side 1504. The front side 1502 can be referred to as a light receiving surface 1502 and the back side 1504 can be referred to as a back surface 1504. The solar cells can include a first doped region 1521 and a second doped region 1522. In an embodiment, the first doped region can be a P-type doped region (e.g., doped with boron) and the second doped region can be an N-type doped region (e.g., doped with phosphorus). The solar cells 1520*a-e* can include an intervening layer (e.g., anti-reflective coating ARC) 1528 on the front side 1502 of the solar cells. The solar cells 1520*a-e* can include a back intervening layer (e.g., back anti-reflective coating BARC) 1526 on the back side 1504 of the solar cells.

Figure 11A:
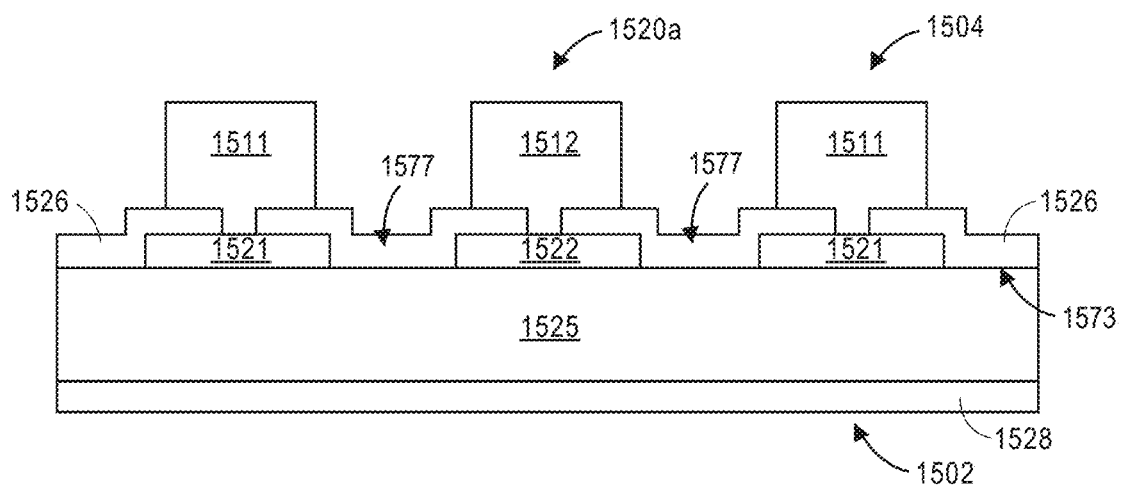
FIGS. 11A-11E illustrate exemplary substrates fabricated using methods, approaches or equipment described herein.

FIG. 11A illustrates an exemplary back-contact solar cell fabricated using methods, approaches or equipment described herein. The back-contact solar cell 1520*a* can include the first and second doped regions 1521, 1522 disposed on a back side 1504 of a solar cell 1520*a*. In an example, the first and second doped regions 1521, 1522 can be doped semiconductor regions. The first and second doped regions 1521, 1522 can be doped polysilicon regions. A thin oxide layer 1573 (e.g., tunnel oxide layer) can be disposed between the first and second doped regions 1521, 1522 and the substrate 1525. The first and second doped regions 1521, 1522 can, instead, be located in the substrate 1525. Conductive contact structures 1511, 1512 are located on the back side 1504 of the solar cell 1520*a*, where the conductive contact structures 1511, 1512 include locally deposited metal on the first and second doped regions 1521, 1522. The first and second doped regions 1521, 1522 can have separation regions 1577 formed there between. In an example, the first and second doped regions 1521, 1522 have trenches formed there between, the trenches extending partially into the substrate, and covered by intervening layer 1562. The trenches can be replaced with intrinsic or lightly doped semiconductor regions.

Figure 11B:
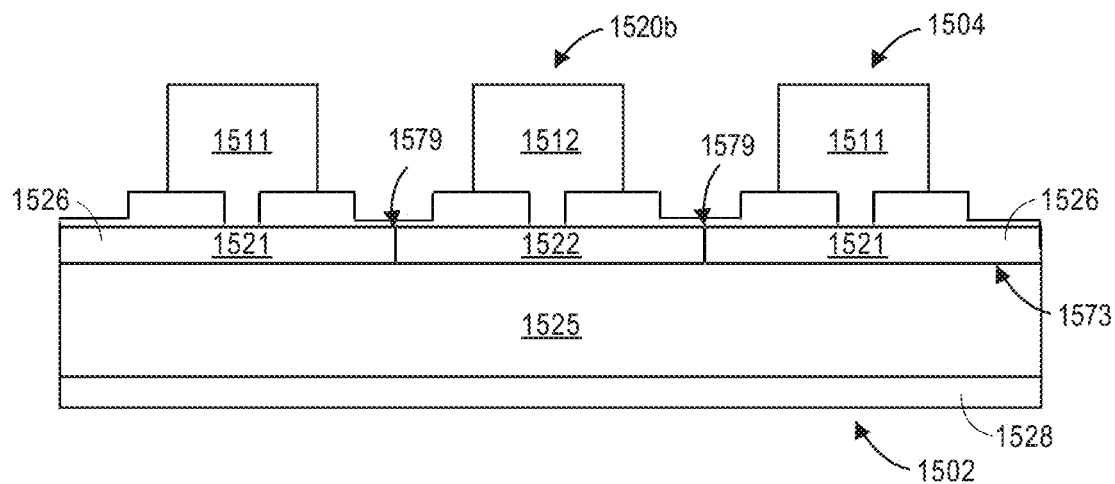

FIG. 11B illustrates another example of a back-contact solar cell 1520*b* fabricated using methods, approaches or equipment described herein, according to some embodiments. The back-contact solar cell 1520*b* can include the first and second doped regions 1521, 1522 disposed on a back side 1504 of a solar cell 1520*b*. In an example, the first and second doped regions 1521, 1522 can be doped semiconductor regions that extend in a continuous layer. In one example, first and second doped regions 1521,1522 are separated by a lightly doped region 1579 there between, where the lightly doped regions can have a doping concentration substantially less than the first and second doped regions 1521, 1522. In an embodiment, a thin oxide layer 1573 (e.g., tunnel oxide layer) can be disposed between the first and second doped regions 1521, 1522 and the substrate 1525. In a particular embodiment, the first and second doped regions 1521, 1522 can be doped polysilicon regions. The first and second doped regions 1521, 1522 can, instead, be located in the substrate 1525. In an embodiment, conductive contact structures 1511, 1512 on the back side 1504 of the solar cell 1520c, where the conductive contact structures 1511, 1512 include locally deposited metal on the first and second doped regions 1521, 1522 formed via a LAMP technique.

Figure 11C:
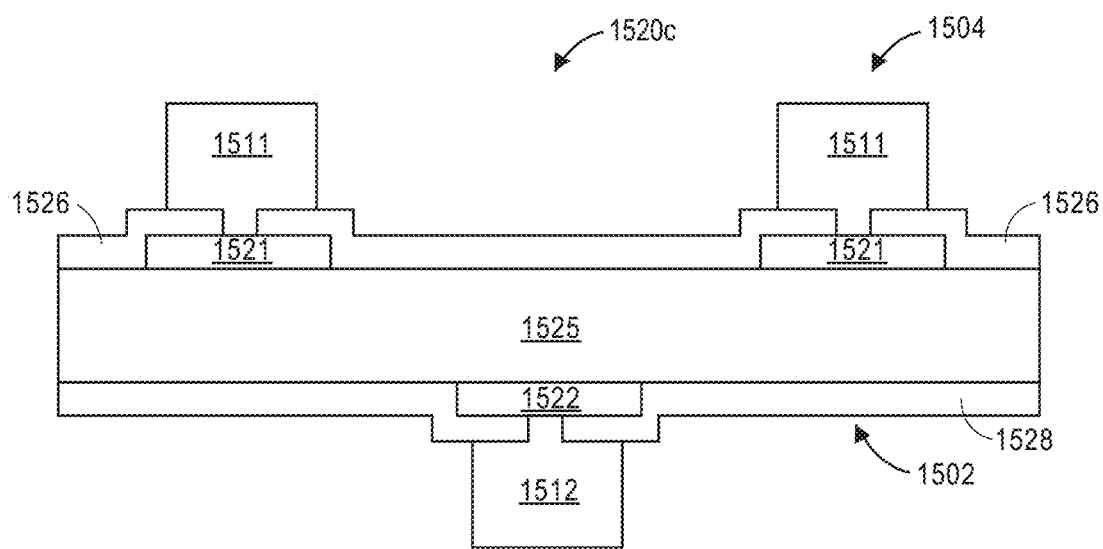

FIG. 11C illustrates an example front-contact solar cell fabricated using methods, approaches or equipment described herein, according to some embodiments. The front-contact solar cell 1520c can include the first doped regions 1521 disposed on the back side 1504 of the solar cell 1520c. In an example, the second doped region 1522 can be disposed on the front side 1502 of the solar cell 1520c. Although one example of a second doped region 1522 is shown, one or more of the second doped region 1522 can be used. Conductive contact structures 1511, 1512 can be on the front and back sides 1504 of the solar cell 1520c, where the conductive contact structures 1511, 1512 include locally deposited metal on the first and second doped regions 1521, 1522 formed via a LAMP technique. The second doped region 1522 can offset from the first doped regions 1521, as shown. The second doped region 1522 can be aligned, e.g., vertically aligned with, the first doped regions 1521.

Figure 11D:
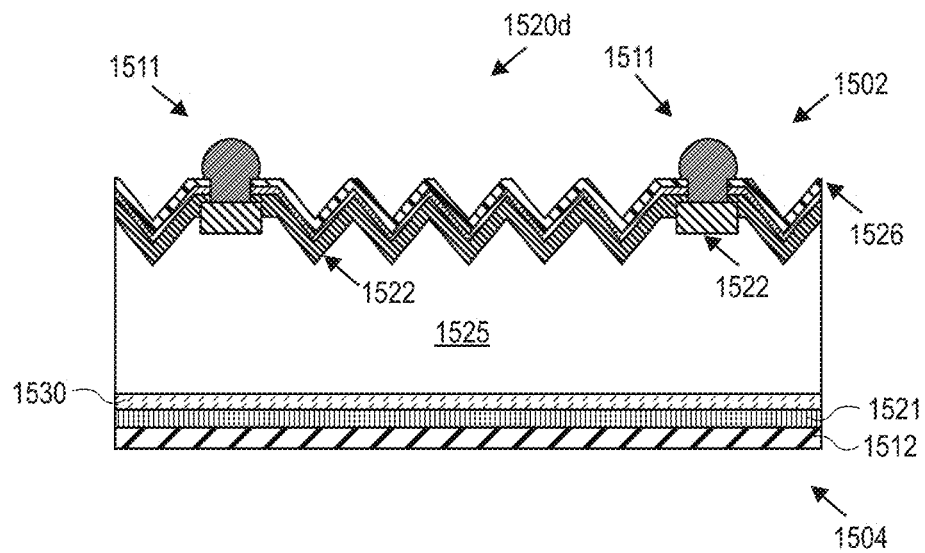

FIG. 11D illustrates an example front-contact solar cell fabricated using methods, approaches or equipment described herein, according to some embodiments. The front-contact solar cell 1520d can include the first doped regions 1521 disposed on the back side 1504 of the solar cell 1520d. Conductive contact structures 1511, 1512 can be formed via a LAMP technique on the front and back sides 1502, 1504 of the solar cell 1520d, respectively, where the conductive contact structures 1511, 1512 include locally deposited metal on the first and second doped regions 1521, 1522. The first and second doped regions 1521, 1522 can include an amorphous silicon region. The solar cell 1520d can include an intervening layer (e.g., an anti-reflective layer coating ARC) 1526 on the front side 1502 of the solar cell 1520d. The solar cells 1520d can include a back intervening layer (e.g., a back anti-reflective coating BARC) 1526 on the back side 1504 of the solar cell 1520d. A thin oxide layer 1530 can be disposed between the first doped region 1521 and the substrate 1525.

Figure 11E:
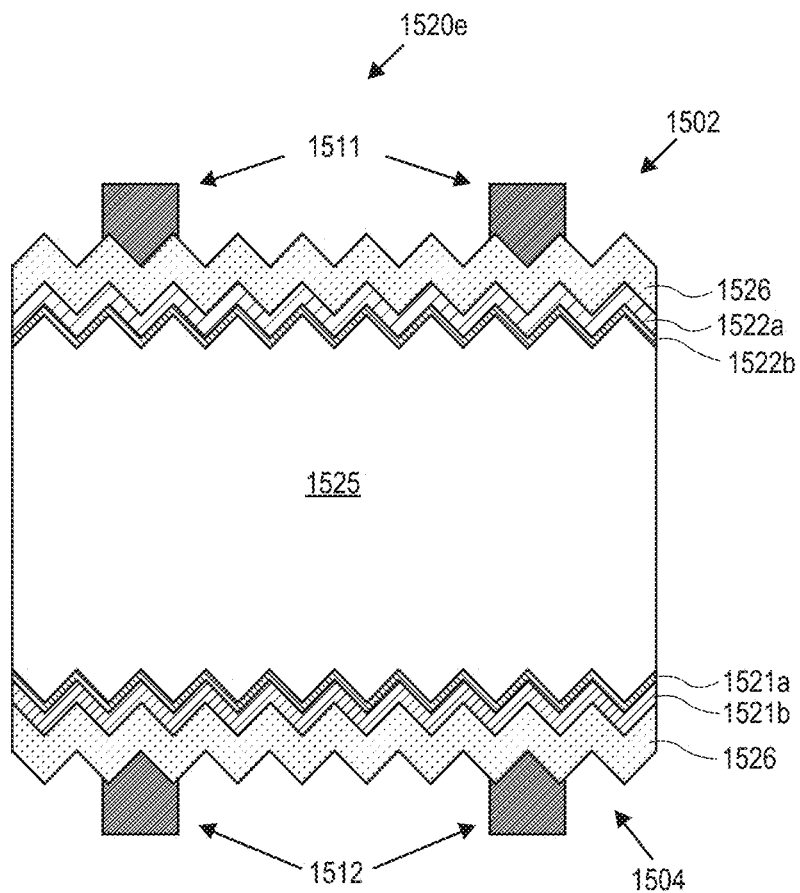

FIG. 11E illustrates another exemplary front-contact solar cell fabricated using methods, approaches or equipment described herein, according to some embodiments. The solar cell 1520e can include the first doped regions 1521a, 1521b disposed on the back side 1504 of the solar cell 1520e. In an example, the second doped region 1522a, 1522b can be disposed on the front side 1502 of the solar cell 1520d. In an embodiment, conductive contact structures 1511, 1512 can be formed via a LAMP technique on the front and back sides 1504 of the solar cell 1520b, respectively, where the conductive contact structures 1511, 1512 include locally deposited metal on the first and second doped regions 1521a, 1521b, 1522a 1522b. The first doped regions 1521a, 1521b can include a doped polysilicon region. The solar cell 1520e can include an intervening layer (e.g., an anti-reflective coating ARC) 1526 on the front side 1502 of the solar cell 1520e. The solar cells 1520e can include a back intervening layer (e.g., a back anti-reflective coating BARC) 1526 on the back side 1504 of the solar cell 1520e.

Although certain materials are described specifically with reference to above described embodiments, some materials can be readily substituted with others with such embodiments remaining within the spirit and scope of embodiments of the present disclosure. For example, in an embodiment, a different material substrate, such as a group material substrate, can be used instead of a silicon substrate. In another embodiment, any type of substrate used in the fabrication of micro-electronic devices can be used instead of a silicon substrate, e.g., a printed circuit board (PCB) and/or other substrates can be used. Additionally, although reference is made significantly to back contact solar cell arrangements, it is to be appreciated that approaches described herein can have application to front contact solar cells as well. In other embodiments, the above described approaches can be applicable to manufacturing of other than solar cells. For example, manufacturing of light emitting diode (LEDs) can benefit from approaches described herein.

Additionally, although solar cells are described in great detail herein, the methods and/or processes described herein can apply to various substrates and/or devices, e.g., semiconductor substrates. For example, a semiconductor substrate can include a solar cell, light emitting diode, microelectromechanical systems and other substrates.

Furthermore, although many embodiments described pertain to directly contacting a semiconductor with a metal foil as a metal source. Concepts described herein can also be applicable to solar applications (e.g., HIT cells) where a contact is made to a conductive oxide, such as indium tin oxide (ITO), rather than contacting a semiconductor directly. Additionally, embodiments can be applicable to other patterned metal applications, PCB trace formation.

Thus, local metallization of semiconductor substrates using a laser beam, and the resulting structures are presented.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims can be formulated during prosecution of this application (or an application claiming priority thereto) to any such combination of features. In particular, with reference to the appended claims, features from dependent claims can be combined with those of the independent claims and features from respective independent claims can be combined in any appropriate manner and not merely in the specific combinations enumerated in the appended claims.

What is claimed is:

1. A method of fabricating a solar cell, the method comprising:
    providing a substrate with an intervening layer thereon, the intervening layer including pre-formed openings to expose portions of the substrate;
    locating a metal foil over the openings in the intervening layer; and exposing the metal foil to a laser beam to form a conductive contact structure electrically connected to the substrate via the openings in the intervening layer, wherein the conductive contact structure includes a locally deposited metal portion of the metal foil, the locally deposited metal portion connected to an unexposed portion of the metal foil by a weakened structure of the metal foil, the weakened structure of the metal foil including patterning, subsequent to the exposing the metal foil to the laser beam, removing at least a portion of the metal foil not exposed to the laser beam, and to leave remaining the weakened structure of the metal foil including the patterning, wherein the substrate comprises a plurality of N-type and P-type semiconductor regions, and wherein the openings in the intervening layer expose portions of the plurality of N-type and P-type semiconductor regions.

2. The method of claim 1, wherein the locating the metal foil comprises locating a continuous sheet of the metal foil.

3. The method of claim 1, wherein the removing at least a portion of the metal foil not exposed to the laser beam comprises forming an edge feature at an edge of the conductive contact structures.

4. The method of claim 1, wherein the exposing the metal foil to the laser beam forms a spatter feature.

5. The method of claim 4, further comprising removing the spatter feature.

6. The method of claim 1, wherein the patterning includes perforation.

* * * * *